US011855414B2

(12) United States Patent
Gerard et al.

(10) Patent No.: US 11,855,414 B2
(45) Date of Patent: Dec. 26, 2023

(54) LIGHT SOURCE ADAPTED TO EMIT PAIRS OF POLARIZATION-ENTANGLED PHOTONS

(71) Applicant: COMMISSARIAT A L'ENERGIE ATOMIQUE ET AUX ENERGIES ALTERNATIVES, Paris (FR)

(72) Inventors: Jean-Michel Gerard, Grenoble (FR); Yoann Cure, Grenoble (FR); Julien Claudon, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 439 days.

(21) Appl. No.: 17/130,205

(22) Filed: Dec. 22, 2020

(65) Prior Publication Data

US 2021/0194213 A1    Jun. 24, 2021

(30) Foreign Application Priority Data

Dec. 23, 2019    (FR) .................................... 19 15514

(51) Int. Cl.
*H01S 5/34*    (2006.01)
*H01S 5/11*    (2021.01)
(Continued)

(52) U.S. Cl.
CPC ............ *H01S 5/3412* (2013.01); *H01L 33/18* (2013.01); *H01L 33/20* (2013.01); *H01S 5/11* (2021.01);
(Continued)

(58) Field of Classification Search
CPC ........ H01S 5/3412; H01S 5/11; H01S 5/3054; H01L 33/18; H01L 33/20; H01L 33/06;
(Continued)

(56) References Cited

U.S. PATENT DOCUMENTS 9,500,519 B2 *    11/2016    Tang ..................... G01J 1/0425

FOREIGN PATENT DOCUMENTS

GB    2 443 220 A    4/2008

OTHER PUBLICATIONS

French Preliminary Search Report dated Sep. 9, 2020 in French Application 19 15514 filed on Dec. 23, 2019 (with English Translation of Categories of Cited Documents & Written Opinion), 16 pages.

(Continued)

*Primary Examiner* — Nicole M Ippolito
*Assistant Examiner* — Hanway Chang
(74) *Attorney, Agent, or Firm* — Oblon, McClelland, Maier & Neustadt, L.L.P.

(57) ABSTRACT

The invention relates to a light source comprising a photonic wire having a single-mode core and adapted to support an optical mode which is degenerate in polarization, comprising an emitter of a pair of photons which are intended to be entangled in polarization. The photonic wire comprises a cladding which is asymmetrical in rotation and extends along a principal transverse axis. Furthermore, the light source comprises a correction device adapted to induce by electrostatic effect a mechanical deformation of the photonic wire in a plane parallel to the substrate, along a deformation axis forming an angle of inclination of between 0° and 90°, these values being exclusive, with respect to the principal transverse axis, the mechanical deformation leading to mechanical strains experienced by the emitter, thus improving the degree of entanglement of the photon pair.

12 Claims, 9 Drawing Sheets

(51) Int. Cl.
| | |
|---|---|
| H01S 5/30 | (2006.01) |
| H04B 10/70 | (2013.01) |
| H01L 33/20 | (2010.01) |
| H01L 33/18 | (2010.01) |
| B82Y 10/00 | (2011.01) |
| H01L 33/44 | (2010.01) |
| H01L 33/06 | (2010.01) |
| B82Y 20/00 | (2011.01) |

(52) U.S. Cl.
CPC ............ *H01S 5/3054* (2013.01); *H04B 10/70* (2013.01); *B82Y 10/00* (2013.01); *B82Y 20/00* (2013.01); *H01L 33/06* (2013.01); *H01L 33/44* (2013.01); *H01L 2933/005* (2013.01)

(58) Field of Classification Search
CPC ... H01L 33/44; H01L 2933/005; H04B 10/70; B82Y 10/00; B82Y 20/00
See application file for complete search history.

(56) References Cited

OTHER PUBLICATIONS

Zeeshan et al., "Proposed Scheme to Generate Bright Entangled Photon Pairs by Application of a Quadrupole Field to a Single Quantum Dot", Physical Review Letters, 122, 227401, 2019, pp. 227401-1-227401-6.

Bennett et al., "Electric-field-induced coherent coupling of the exciton states in a single quantum dot", Nature Physics, vol. 6, Dec. 2010, pp. 947-950.

Wang et al., "Eliminating the fine structure splitting of excitons in self-assembled InAs/GaAs quantum dots via combined stresses", Applied Physics Letters, 101, 063114, 2012, pp. 063114-1-063114-4.

Stevenson et al., "A semiconductor source of triggered entangled photon pairs", Nature, vol. 439, Jan. 2006, pp. 179-182.

Trotta et al., "Universal Recovery of the Energy-Level Degeneracy of Bright Excitons in InGaAs Quantum Dots without a Structure Symmetry", Physical Review Letters, 109, 147401, Oct. 5, 2012, pp. 147401-1-147401-5.

Trotta et al., "Wavelength-tunable sources of entangled photons interfaced with atomic vapours", Nature Communications, 7:10375, Jan. 27, 2016, pp. 1-7.

Kowalik, et al. "Monitoring electrically driven cancellation of exciton fine structure in a semiconductor quantum dot by optical orientation", Applied Physics Letters, 91, 183104, 2007, pp. 183104-1-183104-3.

Bayer et al., "Fine structure of neutral and charged excitons in self-assembled In(Ga)As/(Al)GaAs quantum dots", Physical Review B, vol. 65, 2002, pp. 195315-1-195315-23.

Boeckler et al., "Electrically driven high-Q quantum dot-micropillar cavities", Applied Physics Letters, 92, 091107, 2008, pp. 091107-1-091107-3.

Benson et al., "Regulated and Entangled Photons from a Single Quantum Dot", Physical Review Letters, vol. 84, No. 11, Mar. 13, 2000, pp. 2513-2516.

Claudon et al., "A highly efficient single-photon source based on a quantum dot in a photonic nanowire", Nature Photonics, vol. 4, Mar. 2010, pp. 174-177.

Claudon et al., "Harnessing Light with Photonic Nanowires: Fundamentals and Applications to Quantum Optics", ChemPhysChem, 14, 2013, pp. 2393-2402.

Dousse et al., "Ultrabright source of entangled photon pairs", Nature, vol. 466, Jul. 8, 2010, pp. 217-220.

Dousse et al., "Controlled Light-Matter Coupling for a Single Quantum Dot Embedded in a Pillar Microcavity Using Far-Field Optical Lithography", Physical Review Letters, 101, 267404, Dec. 31, 2008, pp. 267404-1-267404-4.

Friedler et al., "Solid-state single photon sources: the nanowire antenna", Optics Express, vol. 17, No. 4, Feb. 16, 2009, pp. 2095-2110.

De Riedmatten et al., "Long Distance Quantum Teleportation in a Quantum Relay Configuration", Physical Review Letters, vol. 92, No. 4, Jan. 30, 2004, pp. 047904-1-047904-4.

Gurioli et al., "Droplet epitaxy of semiconductor nanostructures for quantum photonic devices", Nature Materials, vol. 18, Aug. 2019, pp. 799-810.

Hours et al., Single photon emission from individual GaAs quantum dots, Applied Physics Letters, vol. 82, No. 14, Apr. 7, 2003, 4 pages.

Joens et al., "Bright nanoscale source of deterministic entangled photon pairs violating Bell's inequality", Scientific Reports, 7:1700, May 10, 2017, 11 pages.

Munsch et al., "Dielectric GaAs Antenna Ensuring an Efficient Broadband Coupling between an InAs Quantum Dot and a Gaussian Optical Beam", Physical Review Letters, 110, 177402, Apr. 26, 2013, pp. 177402-1-177402-5.

Munsch et al., "Linearly Polarized, Single-Mode Spontaneous Emission in a Photonic Nanowire", Physical Review Letters, 108, 077405, Feb. 17, 2012, pp. 077405-1-077405-5.

Somaschi et al., Near-optimal single-photon sources in the solid state, Nature Photonics, vol. 10, May 2016, pp. 340-345.

Trotta et al., "Energy-Tunable Sources of Entangled Photons: A Viable Concept for Solid-State-Based Quantum Relays", Physical Review Letters, 114, 150502, Apr. 17, 2015, pp. 150502-1-150502-5.

Yeo et al., "Strain-mediated coupling in a quantum dot-mechanical oscillator hybrid system", nature nanotechnology, vol. 9, Feb. 2014, pp. 106-110.

Tumanov et al., "Static strain tuning of quantum dots embedded in a photonic wire", Applied Physics Letters, 112, 123102, 2018, 5 pages.

* cited by examiner

LIGHT SOURCE ADAPTED TO EMIT PAIRS OF POLARIZATION-ENTANGLED PHOTONS

TECHNICAL FIELD

The field of the invention is that of light sources adapted to emit pairs of polarization-entangled photons.

PRIOR ART

There are light sources adapted to emit on demand pairs of photons entangled in polarization, the application fields of which are found for example in cryptography, quantum communications, photonic quantum computing and metrology.

FIG. 1A illustrates the energy levels of a semiconductor quantum dot adapted to emit a pair of photons. Such a quantum dot has discrete energy levels because of the confinement of the charges in the three directions of space on a nanometer scale, and the term artificial atom is used by analogy with the discrete electronic states of an atom.

The quantum dot may contain two electron-hole pairs in a so-called biexcitonic state XX. According to the Pauli principle, the electrons have different spin states, as do the holes. Since the lifetime of a biexcitonic state XX is finite, these two electron-hole pairs recombine radiatively by cascade with two photons, thus passing from the biexcitonic state XX to the ground state G via intermediate excitonic states $X_x$ and $X_y$.

Optical dipoles with linear and mutually orthogonal polarizations, denoted $\pi_x$ and $\pi_y$, are associated with these excitonic transitions from XX to $X_x$ or $X_y$, and from $X_x$ or $X_y$ to G. The indices x and y correspond here to the mutually orthogonal optical axes along which the optical dipoles are oriented.

Thus, a first electron-hole pair recombines by passing from the biexcitonic state XX to one of the excitonic states, for example $X_x$, by emitting a photon with linear polarization $\pi_x$; then the second electron-hole pair recombines by passing from the excitonic state $X_x$ to the ground state G by emitting a photon with linear polarity, here necessarily $\pi_x$. However, the first electron-hole pair may also recombine by entering the excitonic state $X_y$ and by emitting a photon with linear polarization $\pi_y$, in which case the second electron-hole pair will then recombine by emitting a photon with linear polarization $\pi_y$.

If the two excitonic states $X_x$ and $X_y$ are degenerate in energy, that is to say if they have substantially the same energy level, the radiative recombination paths are indistinguishable and the photons are then said to be entangled in polarization. Whatever the polarization basis (linear or circular) in which the measurements are carried out, determining the polarization of one of the photons makes it possible to know the polarization of the other photon exactly, without measuring it. More precisely, the photons have a high degree of polarization entanglement when the difference S between the energy levels of the excitonic states $X_x$ and $X_y$, referred to as the energy separation or fine structure separation, is zero.

However, the quantum dot may have a nonzero energy separation S. If the energy separation S is smaller than the width of the emission lines of the excitonic transitions, the degree of entanglement is reduced. If the energy separation S is greater than it, the two recombination paths XX-$X_x$-G and XX-$X_y$-G give emission lines which can be distinguished in the spectral domain since they do not overlap. In this case, it is known that the polarizations of the two emitted photons are correlated only when the measurements are carried out in the linear polarization basis ($\pi_x$, $\pi_y$). There is for example no correlation in the circular polarization basis: the photons then have no degree of entanglement. Attempts are therefore made to reduce the value of the energy separation S in order to improve the degree of entanglement of the pair of photons emitted.

In this regard, the article by Trotta et al. entitled *Energy-Tunable Sources of Entangled Photons: A Viable Concept for Solid-State-Based Quantum Relays*, Phys. Rev. Lett 114, 150502 (2015) describes an example of a light source adapted to emit pairs of photons. The polarization entanglement of the photons is obtained by means of a device for correcting the energy separation S via the application of an anisotropic mechanical strain to a semiconductor quantum dot, thus modifying the electronic properties of the latter. This correction device comprises a piezoelectric actuator with six arms, making it possible to apply an anisotropic mechanical strain to the semiconductor quantum dot located in a membrane.

However, this light source does not make it possible to emit pairs of polarization-entangled photons along a controlled emission direction and with a high extraction efficiency, this directionality and extraction efficiency being required, in particular, in order to obtain efficient coupling to an optical fiber.

The article by Dousse et al. entitled *Ultrabright source of entangled photon pairs*, Nature 466, 217 (2010) describes a light source adapted to emit a pair of entangled photons, according to a first configuration in which a semiconductor quantum dot is located in a resonant optical cavity. More precisely, the light source comprises two resonant optical cavities coupled to one another, which together form an optical cavity which is doubly resonant at the wavelengths of the biexcitonic and excitonic states. The method for manufacturing this light source comprises an annealing step making it possible to reduce the value of the energy separation S to a few microelectron volts, so that the polarization entanglement of the photons is obtained structurally and cannot be adjusted in a controlled way as far as being canceled.

The article by Jöns et al. entitled *Bright nanoscale source of deterministic entangled photon pairs violating Bell's inequality*, Sci Rep 7, 1700 (2017) describes a light source adapted to emit a pair of partially entangled photons, according to a second configuration in which a semiconductor quantum dot is placed in a photonic wire forming a single-mode waveguide. FIG. 1B schematically illustrates such a photonic wire 20, which rests on a substrate 10. The substrate 10 comprises a reflective layer 12, facing which the photonic wire 20 is arranged. The latter is produced from a material with a high refractive index, here InP, and contains a quantum dot 24 made of InAsP. It has transverse dimensions such that it supports a single guided optical mode. It furthermore comprises a mode adapter, here by means of an overall shape tapered toward the upper end, so as to improve the light extraction efficiency along the +Z direction. For this selection of materials, the energy separation S is small enough for the photons to be partially entangled, in particular because the quantum dot is highly symmetrical in the XY plane. However, this source has no means of reducing and canceling the energy separation S, and therefore of maximizing the degree of entanglement.

There is thus a need to provide a light source adapted to emit photon pairs, having a high light extraction efficiency and an emission directionality, the energy separation S of which can be adjusted and reduced in a controlled way in order to improve the degree of polarization entanglement of the pair of photons emitted.

SUMMARY OF THE INVENTION

The object of the invention is to overcome the drawbacks of the prior art at least partly, and more particularly to provide a light source making it possible to emit pairs of polarization-entangled photons along a defined emission direction and with a high light extraction efficiency, the energy separation S of which between the energy levels of the excitonic states $X_x$ and $X_y$ can be adjusted and reduced in a controlled way, thus improving the degree of polarization entanglement of the pair of photons emitted.

To this end, the invention relates to a light source configured to emit a pair of polarization-entangled photons, comprising:
  a substrate, comprising a reflective layer;
  a photonic wire, comprising a core having a refractive index $n_c$ and: being: arranged on the substrate, facing the reflective layer, and extending longitudinally along a principal axis Δ substantially orthogonal to the plane of the substrate; comprising an emitter configured to emit a pair of photons which are intended to be entangled in polarization; having transverse dimensions, in a plane parallel to the substrate and containing the emitter, such that the core forms a single-mode waveguide for the emitted photons, the guided optical mode being degenerate in polarization; these transverse dimensions varying longitudinally in the direction of an upper end of the core so as to form a mode adapter for the guided optical mode;
  an optical excitation device configured to excite the emitter and thus cause spontaneous emission of at least one pair of photons by the emitter.

According to the invention, the photonic wire furthermore comprises a cladding having a refractive index $n_g$ less than $n_c$ and extending in a plane parallel to the substrate, starting from the core, and having a maximum dimension with respect to the principal axis Δ defining a principal transverse axis $At_g$ such that it has an asymmetry of revolution about the principal axis Δ.

The light source furthermore comprises a correction device configured to induce by electrostatic effect a mechanical deformation of the photonic wire in a plane parallel to the substrate, along a deformation axis Ad forming an angle of inclination of between 0° and 90°, these values being exclusive, with respect to the principal transverse axis $At_g$, the mechanical deformation leading to mechanical strains experienced by the emitter, thus improving the degree of entanglement of the photon pair.

Some preferred but nonlimiting aspects of this light source are the following.

The correction device may comprise: at least two electrodes adapted to generate a nonuniform electric field and arranged on either side of the photonic wire in such a way that the photonic wire has a distance $D_p$ from the so-called proximal one of the electrodes less than a distance $D_d$ from the other, so-called distal electrode, the deformation axis Ad being defined as passing through a proximal end of the electrode oriented toward the photonic wire and the principal axis Δ; and an electrical voltage source connected to the electrodes in order to generate said electric field, the value of the voltage being predefined in such a way that the photon pair is entangled in polarization.

The correction device may comprise pillars which rest on the substrate and are separate from the photonic wire, and on which the electrodes rest; the core of the photonic wire and the pillars being produced on the basis of the same crystalline material.

The core of the photonic wire and the pillars may have the same height with respect to the substrate.

The emitter may have a biexcitonic state XX, two excitonic states $X_x$, $X_y$, and a ground state G, two optical dipoles being associated with the excitonic transitions between the biexcitonic state XX and the excitonic states $X_x$, $X_y$, and between the excitonic states $X_x$, $X_y$, and the ground state, the optical dipoles having linear polarizations oriented along mutually orthogonal optical axes x, y and being located in a plane parallel to the substrate, the deformation axis Ad being substantially aligned with one of the optical axes x, y.

The emitter may be located on the principal axis Δ, to within 20 nm.

The core of the photonic wire may have a symmetry of rotation about the principal axis Δ with an order equal to 4.

The core of the photonic wire may be produced on the basis of a crystalline material selected from among III-V compounds or II-VI compounds, and the emitter may be formed by at least one semiconductor quantum dot.

The invention also relates to a method for manufacturing a light source according to any one of the characteristics above, comprising the following steps:
  producing a stack comprising: a substrate comprising a reflective layer coated with a transparent etch stop layer; and a first and a second layer resting on the transparent layer and produced from a crystalline material with a refractive index $n_c$, between which the emitter is located;
  producing a core of the photonic wire by localized etching of the stack;
  producing the cladding in such a way that it extends from the core along a principal transverse axis $At_g$ in a plane parallel to the plane of the substrate.

The cladding may be produced by physical vapor deposition along a deposition direction parallel to the desired principal transverse axis $At_g$ and forming an angle of inclination with respect to the plane of the substrate of less than 90°, and preferably less than or equal to 20°.

The cladding may be produced by deposition of a dielectric encapsulation layer enclosing the core of the photonic wire in a plane parallel to the substrate over the entire height of the core, lithography then localized etching of the dielectric encapsulation layer.

Pillars may simultaneously be produced by localized etching of the stack during the production of the core of the photonic wire. At least two electrodes may be produced on upper faces of the pillars, said electrodes being arranged on either side of the core of the photonic wire.

BRIEF DESCRIPTION OF THE DRAWINGS

Other aspects, aims, advantages and characteristics of the invention will become clearer on reading the following detailed description of preferred embodiments thereof, which is given by way of nonlimiting example and made with reference to the appended drawings, in which.

DETAILED EXPLANATION OF PARTICULAR EMBODIMENTS

In the figures and the rest of the description, references which are the same represent elements which are identical or similar. Furthermore, the various elements are not represented to scale in order to increase the clarity of the figures. Moreover, the various embodiments and variants are not mutually exclusive and may be combined with one another. Unless otherwise indicated, the terms "substantially", "about", "of" the order of mean to within 10%, and preferably to within 5%. Moreover, the terms "contained between . . . and . . . " and equivalents mean that the bounds are inclusive, unless otherwise mentioned.

The invention relates to a light source adapted to emit at least one pair of photons and making it possible to adjust the degree of polarization entanglement of the emitted photons. It is thus adapted to emit on demand, by spontaneous emission, a pair of photons of which the quantum state of one of the photons is indissociable from the quantum state of the other photon. A quantum state of a photon is intended to mean the properties of the photon in terms of polarization, frequency and shape of the wave packet. In this example, the photons are said to be entangled when the polarization state of one of the photons is defined by the polarization state of the other photon, whatever the polarization basis selected for carrying out the measurement of their polarization states.

Figure 1A:
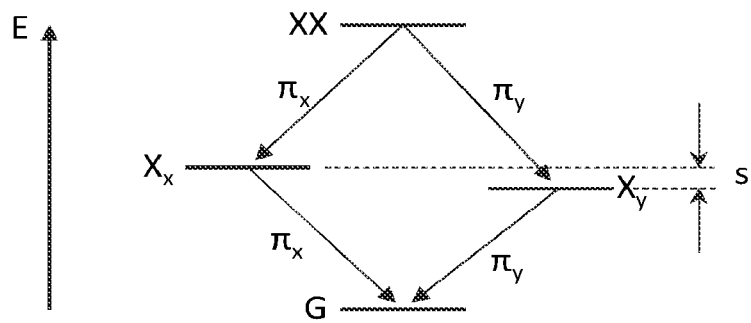
FIG. 1A, already described, illustrates the energy levels of the biexcitonic state XX and of the excitonic states $X_x$ and $X_y$ with respect to the ground state G of an emitter adapted to emit a pair of photons.
Figure 1B:
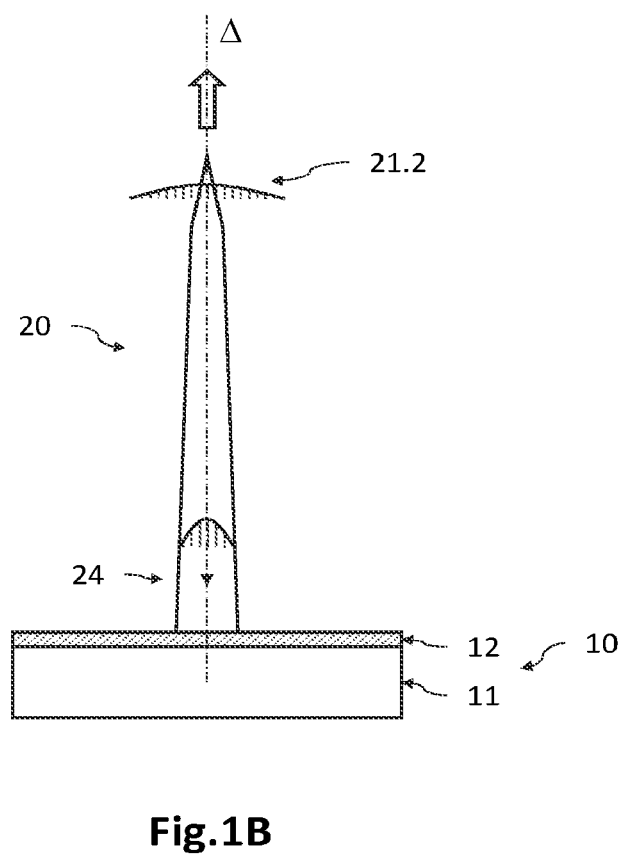
FIG. 1B, already described, is a partial schematic view in cross section of a source of a pair of polarization-entangled photons according to an example of the prior art, in which the emitter is located in a photonic wire forming a single-mode waveguide.

The light source comprises a photonic wire forming a single-mode waveguide of the type described above in connection with FIG. 1B, inside which a photon emitter forming an artificial atom is located. The photon emitter may be likened to a quantum electronic system with two levels. Such a single-photon emitter thus has discrete energy levels, and the term artificial atom is then used by analogy with the discrete electronic states of an atom. Such an emitter may be a semiconductor quantum dot, the confinement of the charges of which along the three directions of space on a nanometer scale makes the energy levels discrete.

Taking into account the spin degree of freedom, each electronic state of an artificial atom may contain 0, 1 or 2 electrons. As explained in the article by Benson et al. entitled *Regulated and Entangled Photons from a Single Quantum Dot*, Phys. Rev. Lett. 84, 2513-2516 (2000), the emission of pairs of entangled photons may be described by considering four different excitation states of the artificial atom: the ground state G, for which no electron is in the higher level; two excitonic states $X_x$ and $X_y$, the energies $E_x$ and $E_y$ of which are similar but generally different and for which one electron is in the higher level; lastly a biexcitonic state XX, for which two electrons are in the higher level and none are in the lower level and the energy $E_{xx}$ of which is close to $2E_x$.

When the artificial atom consists of semiconductor materials, the hole terminology is customarily used to describe the absence of an electron, and the exciton terminology is used to refer to an elementary excitation constituted by an electron in the higher level and a hole in the lower level. Using this terminology, the emitter may contain a first electron-hole pair (exciton) or two electron-hole pairs (biexciton). If it is in this biexcitonic state XX, it spontaneously relaxes to one of the two excitonic states $X_x$ or $X_y$ then to the ground state G by emitting a pair of photons. In particular because of the Coulomb interaction between the electron-hole pairs, the energy differences between the transitions (biexciton/exciton and exciton/ground state) are different, so that the emitted photons have different wavelengths.

As indicated above, an optical dipole $d_x$ is associated with each excitonic transition $XX-X_x$ and $X_x-G$, and an optical dipole $d_y$ is associated with each excitonic transition $XX-X_y$ and $X_y-G$, these two optical dipoles $d_x$ and $d_y$ furthermore being oriented along optical axes, denoted x and y, which are contained in the plane of the quantum dot (parallel to the plane of the substrate) and are mutually orthogonal. These optical axes x and y define the orientation of the linear polarization in the far field.

In the rest of the description, the single-photon emitter is a semiconductor quantum dot formed by a nanometric island of a crystalline semiconductor compound, for example InAs, isolated in a high-index crystalline material, for example GaAs, which forms the core of the photonic wire. Thus, at low temperature (for example a few kelvin), a laser pulse which is short compared with the radiative lifetime of the quantum dot makes it possible to create a biexciton in the quantum dot, and therefore make the latter pass from its ground state G to its biexcitonic state XX. At rest, that is to say in the relaxed state, the quantum dot does not have an electron or hole. To this end it is intrinsic, that is to say not intentionally doped.

As indicated above, however, in the absence of external perturbations (for example just after manufacture, as-grown), the emitter generally has an energy separation S of nonzero value $S_0$, that is to say the energy difference between the excitonic states $X_x$ and $X_y$ is greater than the width of the emission lines associated with these excitonic transitions. As described in detail below, the light source according to the invention makes it possible to adjust the energy separation S in a controlled way in order to reduce it and even cancel it, preferably to better than within the width of the emission lines, and thus to improve or even maximize the polarization entanglement of the photon pair.

The degree of polarization entanglement of the photon pair is associated here on the one hand with the value of the energy separation S, and on the other hand with the difference between the lifetimes of the excitons $X_x$ and $X_y$. Thus, maximizing the degree of entanglement is equivalent to reducing, and preferably canceling, the energy separation S on the one hand, and making the lifetimes of the excitons $X_x$ and $X_y$ substantially equal, on the other hand. In the scope of the invention, the light source makes it possible to reduce and cancel the energy separation S in a controlled way, while obtaining excitons $X_x$ and $X_y$ with substantially equal lifetimes, thus maximizing the degree of entanglement of the photon pair.

Figure 2A:
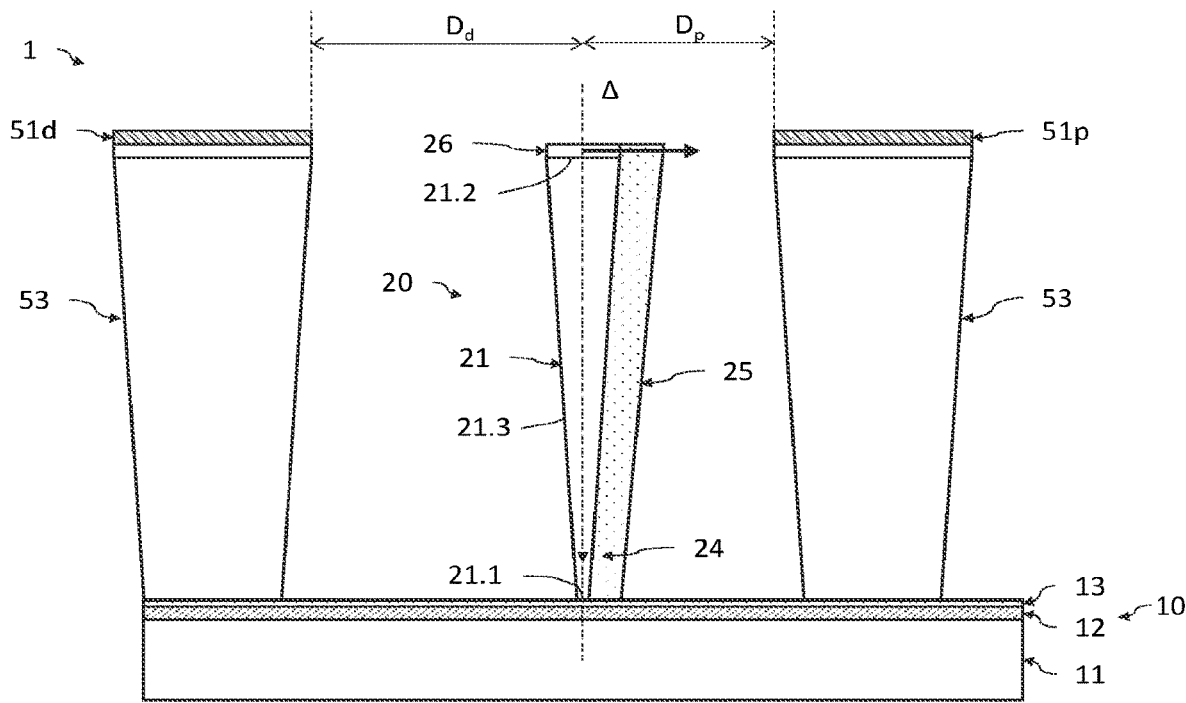
FIGS. 2A and 2B are partial schematic views in cross section (FIG. 2A) and in top view (FIG. 2B) of a light source according to an embodiment in which the core of the photonic wire has a flared shape (photonic trumpet)
Figure 2B:
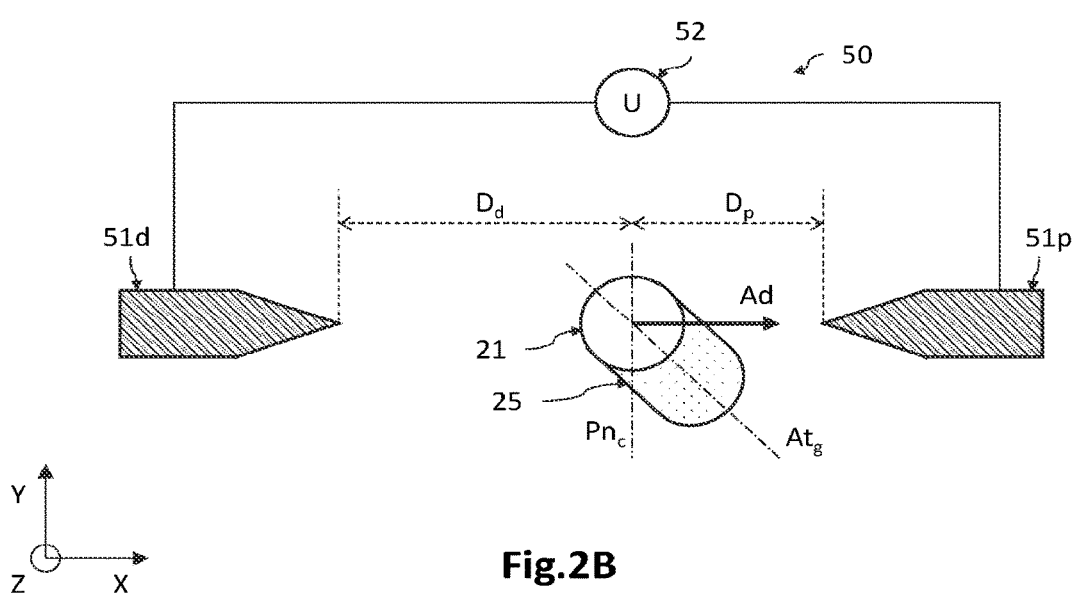

FIGS. 2A and 2B are partial schematic views, respectively in section and top view, of a light source 1 according to one embodiment, the light source being adapted to control the degree of entanglement of the photon pair and thus to emit pairs of polarization-entangled photons.

In general, the light source 1 comprises a photonic wire 20 which rests on a substrate 10, and a correction device 50 adapted to deform the photonic wire 20 by electrostatic effect and thus to generate mechanical strains experienced by the emitter 24 such that the degree of entanglement of the photon pair is improved. It also comprises an optical excitation device 30 adapted to cause the spontaneous emission of a pair of photons by the emitter 24, and it may comprise a collection device 40 capable of optically collecting the emitted photons and, for example, of establishing optical coupling between the photonic wire 20 and an external waveguide 43.

In this first embodiment, the core 21 of the photonic wire 20 has an overall shape flared in the direction of its upper end, that is to say it has a widening of its local diameter when moving away from the substrate 10. The core 21 of the photonic wire 20 thus forms a "photonic trumpet", according to the expression given in particular in the article by Munsch et al. entitled *Dielectric GaAs Antenna Ensuring an Efficient Broadband Coupling between an InAs Quantum-Dot and a Gaussian Optical Beam*, Phys. Rev. Lett. 110, 177402 (2013). Furthermore, the emitter 24 of the photon pair, in other words the artificial atom, is a quantum dot produced from an intrinsic semiconductor material and located in the high-index crystalline material on the basis of which the core 21 of the photonic wire 20 is formed.

Here and for the rest of the description, a right-handed orthogonal three-dimensional coordinate system XYZ is defined, in which the axes X and Y form a plane parallel to the principal plane of the substrate 10 and the Z axis is oriented in the direction of the photonic wire 20 and is parallel to the principal axis of the latter. Furthermore, the terms "lower" and "upper" are intended to refer to positioning which increases when moving away from the substrate 10 along the +Z direction.

The substrate 10 is a support on which the photonic wire 20 rests. It is in the form of a thick, preferably rigid, principal layer 11 produced from one or more materials. The principal layer 11 may be a semiconductor wafer having, for example, a thickness of from one to several hundreds of microns. Here, it may be produced from doped or undoped GaAs.

A reflective layer 12 coats the principal layer 11 at least locally. It is located under the photonic wire 20 and is adapted to reflect the photons emitted by the emitter 24 of the photonic wire 20. The reflective layer 12 may be produced from a metallic material, for example gold, with a thickness of for example between 100 nm and 300 nm.

Here, a dielectric layer 13 coats the reflective layer 12 and the principal layer 11. It is produced from a dielectric material with low absorbance at the emission wavelength $\lambda_e$, and advantageously forms an etch stop layer with respect to etching agents used during various etching steps employed by the method for manufacturing the light source 1. The dielectric layer 13 may be produced in particular from a silicon nitride, for example $Si_3N_4$, with a thickness of approximately 9 to 11 nm. As a variant, as indicated below, the dielectric layer 13 may be replaced with a transparent layer produced from an electrically conductive material such as ITO, in particular when excitation of the emitter 24 is carried out by electrical injection.

The photonic wire 20 rests on the substrate 10 and is arranged facing the reflective layer 12, that is to say on its vertical along the Z axis. In general, the core 21 of the photonic wire 20 is in the form of a three-dimensional element elongated along a principal axis Δ substantially orthogonal to the XY plane of the substrate 10. In other words, it has a longitudinal dimension (height h) along the principal axis Δ which is greater than the transverse dimensions. The photonic wire 20 is formed by the core 21, which has a high refractive index $n_c$, and a cladding 25 which encloses the core 21 at least partially and has a low refractive index $n_g$, in other words a refractive index $n_g$ less than $n_c$.

The principal axis Δ is defined as being orthogonal to the XY plane and passing through the centroids of the cross sections of the core 21 of the photonic wire 20 in the XY planes, in the case in which the photonic wire 20 is mechanically at rest, that is to say not deformed in the XY plane.

The core 21 of the photonic wire 20 forms a single-mode waveguide at the emission wavelength $\lambda_e$, that is to say it supports a single guided optical mode, for example the fundamental mode. Furthermore, the core 21 of the photonic wire 20 is dimensioned in such a way that the guided optical mode is degenerate in polarization, that is to say it supports two fundamental modes with mutually orthogonal linear polarization and of the same effective index, or, equivalently, two fundamental modes with circular polarization in opposite senses and of the same effective index.

To this end, it has transverse dimensions, in the XY plane containing the emitter 24, which are selected so as to obtain the single-mode nature of the waveguide. More precisely, it has a local diameter, in the cross section containing the emitter 24, substantially equal to $\lambda_e/n_c$. In the case of a quantum dot 24 made of InAs and adapted to emit photons at a wavelength $\lambda_c$ of approximately 950 nm, the local diameter of the core 21 of the photonic wire 20 at the quantum dot 24 is between approximately 150 nm and 300 nm, preferably equal to approximately 200 nm.

The shape of the cross section of the core 21 of the photonic wire 20 in the XY plane is selected in such a way that the core 21 of the photonic wire 20 supports a fundamental mode which is degenerate in polarization. This is obtained by the cross section of the core 21 having a symmetry of rotation about the principal axis Δ of order 4. This therefore includes all the symmetries of rotation about the principal axis Δ which are compatible with the order 4, that is to say symmetries of rotation of order 8, 12, . . . , but also axial symmetry (i.e. symmetry of revolution). It may thus be a square, an octagon, a dodecagon, a disk, or any other nonpolygonal or circular shape satisfying symmetry of revolution about the principal axis Δ of order 4. Preferably, the cross section is circular along the principal axis Δ, so that the core 21 supports two degenerate fundamental modes, whether the choice is made to describe them in a basis of linear or circular polarizations.

Here, a cross section is intended to mean a section of the core 21 of the photonic wire 20 in an XY plane parallel to the substrate 10 and therefore orthogonal to the principal axis Δ. The transverse dimensions are defined by an equivalent diameter associated with the cross section of the core 21 of the photonic wire 20. It may be the diameter of a disk having the same surface as the cross section of the photonic wire 20. The local diameter is the diameter of the core 21 of the photonic wire 20 for a cross section at a given height thereof. The average diameter is the mean, for example the arithmetic mean, of the local diameters along the core 21 of the photonic wire 20 or a portion thereof.

The transverse dimensions (local diameter) of the core 21 of the photonic wire 20, that is to say its dimensions in an XY plane, may for example be between 10 nm and 5 μm, and preferably between 100 nm and 2 μm. Insofar as the transverse dimensions of the core 21 of the photonic wire 20 have an increase along the +Z direction, the height of the photonic wire 20 is greater than the maximum transverse dimensions of the core 21, for example 2 times and preferably at least 5 times greater. The height h is defined as being the distance along the Z axis between the lower end of the photonic wire 20 in contact with the substrate 10 and its upper end. The lower end and the upper end of the core 21 of the photonic wire 20 are connected to one another by a lateral border.

Furthermore, the core 21 of the photonic wire 20 is produced on the basis of a crystalline material with a high refractive index $n_c$, here GaAs with a refractive index $n_c$ equal to 3.45. It is enclosed by an environment with a low refractive index. This is at least partly the cladding 25 (described in detail below) which has a refractive index $n_g$ less than $n_c$ and extends at least partially around and in contact with the core 21 in the XY plane, and optionally a vacuum or a gas. In the case in which the emitter 24 is a semiconductor quantum dot, the high-index crystalline material is selected as a function of the semiconductor compound of the quantum dot. Thus, the high-index crystalline material may be a III-V compound, for example GaAs or InP when the quantum dot 24 is produced from InAs, or AlN when the quantum dot 24 is produced from GaN. In this first embodiment, the core 21 of the photonic wire 20 is produced from GaAs and comprises at least one quantum dot 24 made of InAs. Other combinations of materials are possible, both among III-V compounds and among II-VI compounds, as a function of the desired emission wavelength $\lambda_e$. As a variant, the emitter 24 may be a quantum dot formed by a local thickness fluctuation of a quantum well, as described in the article by Hours et al. entitled *Single photon emission from individual GaAs quantum dots*, Appl. Phy. Lett. 82, 2206 (2003). It may also be a GaAs quantum dot in a photonic wire made of GaAlAs, using droplet epitaxy as the method for manufacturing the quantum dot, as described in the article by Gurioli et al. entitled *Droplet epitaxy of semiconductor nanostructures for quantum photonic devices*, Nat. Mater. 18, 799-810 (2019).

The emitter 24 is adapted to emit, by spontaneous emission, a pair of photons by biexciton/exciton transition and exciton/ground state transition. It therefore has two optical dipoles $d_x$, $d_y$ oriented respectively along mutually orthogonal optical axes x and y located in the XY plane. In this example, it is a quantum dot produced from an intrinsic (not intentionally doped) crystalline semiconductor compound, the bandgap energy of which determines the wavelength $\lambda_e$ of the emitted photons.

Preferably, the photonic wire 20 comprises only a single quantum dot 24, preferably arranged on the principal axis Δ of the core 21 of the photonic wire 20, to within 20 nm, allowing the lifetimes of the excitons $X_x$ and $X_y$ to be made substantially equal, thus contributing to improving the degree of entanglement of the photon pair.

It may be a quantum dot 24 made of InAs in a continuous, so-called anchoring layer made of InAs, which extends in a plane parallel to the XY plane. As a variant, the photonic wire 20 may comprise a plurality of quantum dots arranged in the same anchoring layer. The quantum dot 24 is preferably arranged at a height of approximately 100 nm with respect to the substrate 10, where the local diameter of the core 21 of the photonic wire 20 is preferably equal to approximately 200 nm. In the case in which the emitter 24 is formed by a plurality of quantum dots, the latter may have dimensions which are not strictly identical, and may then emit photons at slightly different wavelengths. In this case, as described below, the collection device 40 advantageously comprises a spectral filter 41 in order to transmit only the photons emitted by the selected quantum dot 24.

Furthermore, the core 21 of the photonic wire 20 comprises a mode adapter making it possible to optimize the light extraction of the guided mode from the photonic wire 20 and to obtain an emission diagram of Gaussian shape with a low numerical aperture. More precisely, the core 21 of the photonic wire 20 has a longitudinal variation of the local diameter in the direction of the upper end, so as to progressively deconfine the guided mode, thus making it possible to obtain an emission diagram in the far field which is more directional and thus adapted to efficient coupling to an external waveguide. The local diameter thus passes, preferably monotonically, from a first extremum at its lower end 21.1, or starting from a given height, to a second extremum different to the first at the upper end 21.2.

In this embodiment, the core 21 of the photonic wire 20 has a flared shape in the sense that its local diameter passes, along the +Z direction, from a minimum value $d_{min}$ to a maximum value $d_{max}$ located at the upper end 21.2. The longitudinal variation may be monotonic and linear. In this example, the core 21 of the photonic wire 20 has a flared overall shape in the sense that the minimum value $d_{min}$ is located at the lower end 21.1 and the local diameter increases monotonically and substantially linearly from $d_{min}$ to $d_{max}$. As a variant (not represented), the core 21 of the photonic wire 20 may have a flared shape only over a given height, and not over the entire height of the wire. Thus, in this exemplary case, the local diameter first remains substantially constant and equal to $d_{min}$ over a nonzero height starting from the lower end 21.1, then increases to the maximum value $d_{max}$ at the upper end 21.2.

As a variant, and as described in detail below (cf. FIG. 6), the core 21 of the photonic wire 20 may have a tapered shape in the sense that the local diameter passes, along the +Z direction, from a maximum value $d_{max}$ to a minimum value $d_{min}$ located at the upper end 21.2. The longitudinal variation may be monotonic and linear. The core 21 of the photonic wire 20 may have a tapered shape over the entire height of the wire or over only a part of the wire. In the latter case, along the +Z direction, the local diameter first remains substantially constant and equal to $d_{max}$ over a nonzero height then decreases as far as the upper end 21.2, which has a local diameter equal to $d_{min}$.

By way of example, in this embodiment in which core 21 of the photonic wire 20 has a flared overall shape, the core 21 of the photonic wire 20 may have a height of the order of approximately 12 μm and a maximum local diameter $d_{max}$ of approximately 1.5 μm at the upper end, the quantum dot 24 being located at a distance of approximately 100 nm from the substrate 10 and the local diameter at the quantum dot 24 being approximately 200 nm. The local diameter has a monotonic and substantially linear longitudinal variation with an angle of inclination a of the lateral border which is substantially constant along the Z axis and is between approximately 3° and 5°.

As a variant, in the case in which the core 21 of the photonic wire 20 has a tapered shape (FIG. 6), the core 21 of the photonic wire 20 may have a height of the order of 10 μm or less, a minimum diameter $d_{min}$ of approximately 150 nm at the upper end 21.2, a monotonic and linear decrease of the local diameter along the −Z direction with an angle of inclination of the order of approximately 1° to 2° over a height of approximately 1 μm, then a local diameter which is substantially constant and equal to approximately 200 nm as far as the lower end 21.1 of the core 21 of the photonic wire 20.

However, such a photon pair emitter 24 may have a nonzero energy separation S between the energy levels of the excitonic states $X_x$ and $X_y$, that is to say an energy separation S greater than the width of the emission lines associated with the excitonic transitions.

In order to reduce this energy separation S at least to a value less than the width of the excitonic emission lines, and thus to improve the degree of polarization entanglement of the photon pair, one idea may consist in subjecting the quantum dot 24 to suitable mechanical strains, as indicated in the article by Trotta et al. 2015, that is to say ones which are oriented along the optical axes x and y of the optical dipoles associated with the excitonic transitions $X_x$ and $X_y$. In this case, attempts may be made to deform the photonic wire 20 in the XY plane, this wire then being formed only by the core 21 made of GaAs without the cladding 25 described below, along a deformation axis Ad preferably aligned with the optical axis x or the optical axis y.

However, as shown by the article by Yeo et al. entitled *Strain-mediated coupling in a quantum dot-mechanical oscillator hybrid system*, Nat. Nanotechnol. 9, 106-110, (2014), deformation of the photonic wire 20 (here displacement of the upper end in the XY plane) leads to the appearance of a plane $Pn_c$ which is neutral in deformation in the cross section in which the quantum dot 24 is located, this neutral plane $Pn_c$ being oriented orthogonally to the deformation axis Ad and passing through the principal axis Δ. This is the case when the core 21 has a high degree of symmetry of rotation about the principal axis Δ.

Thus, in the case in which the quantum dot is located on the principal axis Δ, deformation of a photonic wire 20 formed only by the core 21 as described above does not make it possible to apply a nonzero mechanical strain to the quantum dot 24, so that the energy separation S is then not reduced. The mechanical strain in question here is a mechanical strain applied adjustably by a device for deforming the photonic wire. It is therefore an (additional) mechanical strain which is added to a possible mechanical strain which the quantum dot may experience after its production.

Another idea may then consist in displacing the quantum dot 24 in the XY plane orthogonally to this neutral plane $Pn_c$, and in deforming the photonic wire 20 as in the article by Yeo et al. 2014 (displacement of the upper end of the photonic wire 20 in the XY plane along a deformation axis, here oriented along the X axis).

Figure 3A:
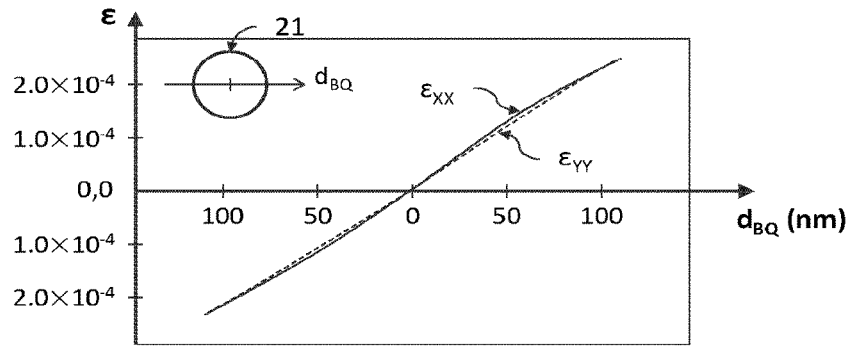
FIG. 3A illustrates an example of development of the deformation ε experienced by a quantum dot as a function of its transverse position $d_{BQ}$ with respect to the principal axis Δ, the quantum dot being located in a photonic wire formed by a core not coated with a cladding having asymmetry of revolution (or axial asymmetry), when the upper end of the photonic wire has been displaced in XY plane.

In this regard, FIG. 3A illustrates an example of the development of the deformations $\varepsilon_{XX}$ and $\varepsilon_{YY}$ associated with the deformation tensor of the quantum dot 24 as a function of the distance $d_{BQ}$ thereof with respect to the neutral plane $Pn_c$. Here, the neutral plane $Pn_c$ passes through the Y axis and the distance $d_{BQ}$ is measured along the x axis, starting from the principal axis Δ. The deformation $\varepsilon_{XX}$ is therefore oriented along the X axis of the coordinate system XYZ, and the deformation $\varepsilon_{YY}$ is oriented along the Y axis. The axes X and Y of the coordinate system XYZ (and therefore the deformations $\varepsilon_{XX}$ and $\varepsilon_{YY}$) are preferentially aligned here along the optical axes x and y of the optical dipoles associated with the excitonic transitions.

In this example, the upper end 21.2 of the photonic wire 20 experiences a displacement δ of approximately 80 nm along the X axis. The photonic wire 20 is formed only by the core 21 made of GaAs, the cross section of which along the principal axis Δ is circular. It has a height of approximately 20 μm. The quantum dot 24 is made of InAs and located at a distance of approximately 100 nm from the substrate 10 and the local diameter of the photonic wire 20, in the cross section in which the quantum dot 24 is located, is of the order of 200 nm.

As illustrated in FIG. 3A, the deformations $\varepsilon_{XX}$ and $\varepsilon_{YY}$ of the strain tensor associated with the quantum dot 24 are zero when the latter is located on the principal axis Δ and therefore in the neutral plane $Pn_c$. The positioning $d_{BQ}$ of the quantum dot 24 along the X axis leads to making the deformation $\varepsilon_{XX}$ nonzero but equal to the deformation $\varepsilon_{YY}$. Moreover, it is found that the values of the deformations $\varepsilon_{XX}$ and $\varepsilon_{YY}$ develop in the same way, so that the difference $\varepsilon_{XX}-\varepsilon_{YY}$ remains substantially nonzero whatever the offset $d_{BQ}$ of the quantum dot 24 along an axis orthogonal to the neutral plane $Pn_c$.

Now, Trotta et al. 2015 has shown that the energy separation S is proportional to the difference $\varepsilon_{XX}-\varepsilon_{YY}$, so that the offset $d_{BQ}$ of the quantum dot 24 with respect to the neutral plane $Pn_c$, for a photonic wire 20 formed only by the core 21 as described above without the cladding 25 according to the invention, does not make it possible to reduce the energy separation S. On the other hand, the bandgap energy of the quantum dot 24 is modified, as shown by the article by Yeo et al. 2014.

Thus, in order to improve the degree of entanglement associated with the pair of photons emitted by the light source 1, a photonic wire 20 is produced which has a substantially isotropic nature in optical terms and an anisotropic nature in mechanical terms. More precisely, the photonic wire 20 comprises:

a core 21 forming a single-mode waveguide whose guided optical mode is degenerate in polarization and which therefore has a degree of symmetry of rotation of the order of 4 about the principal axis Δ, that is to say a degree of symmetry of order 4, 8, 12, etc. ... or an axial symmetry;

a cladding 25 with a low refractive index, which coats the core 21 at least partially and extends in an XY plane parallel to the substrate 10 along a principal transverse axis $At_g$, so that the cladding 25 has an asymmetry of revolution with respect to the principal axis Δ (or axial asymmetry), and the photonic wire 20 formed by the core 21 and the cladding 25 therefore has anisotropic mechanical properties in the XY plane.

Associated with this particular structural configuration of the photonic wire 20 is a correction device 50 adapted to induce by electrostatic effect a mechanical deformation of the photonic wire 20 in an XY plane parallel to the substrate 10, along a deformation axis Ad which forms an angle of inclination in the XY plane of between 0° and 90°, these values being exclusive, with respect to the principal transverse axis $At_g$ of the cladding 25. The emitter 24 then experiences mechanical strains such that the energy separation S can be adjusted and reduced in a controlled way, thus making it possible to maximize the degree of polarization entanglement of the photon pair.

Preferably, this angle of inclination between Ad and $At_g$ is between approximately 20° and 70°, and it is advantageously between approximately 30° and 40°, thus improving the efficiency of correction and modification of the value of the energy separation S. Furthermore, the deformation axis Ad is preferably oriented along the optical axis x or along the optical axis y of the optical dipoles $d_x$, $d_y$ associated with the excitonic transitions, so as likewise to improve the efficiency of correction and modification of the value of the separation S.

The photonic wire 20 comprises a cladding 25 which at least partly coats the lateral border of the core 21 in the XY plane. It extends in the XY plane along a principal transverse axis $At_g$, that is to say it has a maximum radial dimension (orthogonal to the principal axis Δ) in the XY plane, starting from the core 21, which defines the principal transverse axis $At_g$. In other words, in the XY plane, the cladding 25 has a length oriented along the principal transverse axis $At_g$ and a width oriented along an axis orthogonal to the axis $At_g$, the length being greater than the width. This principal transverse axis $At_g$ is secant and orthogonal to the principal axis Δ and passes through the point of the cladding 25 of maximum radial dimension in the XY plane. This principal transverse axis $At_g$ is preferably the same whatever the height of the photonic wire 20.

Thus, the cladding 25 has an asymmetry of revolution with respect to the principal axis Δ, that is to say it has a shape which is not a cylinder of revolution about Δ. The cladding 25 may also be described as being of axial asymmetry about Δ, the concepts of axial symmetry and symmetry of revolution being the same here.

Thus, the fact that the cladding 25 has an asymmetry of revolution with respect to the principal axis Δ, because of its principal transverse axis $At_g$, makes the mechanical properties of the photonic wire 20 anisotropic in the XY plane, while the optical properties of the core 21 alone are substantially isotropic in the XY plane because the core 21 has a high order (equal to 4) of symmetry of rotation about the principal axis Δ. The substantially isotropic nature of the optical properties of the core 21 is to be understood here in the sense of symmetry of rotation of order 4 about the principal axis Δ. Thus, the core 21 has the same optical properties for the optical dipole $d_x$ as for the optical dipole $d_y$, which are mutually orthogonal. Furthermore, the fact that the cladding 25 has a low refractive index makes it possible not to modify the optical properties associated with the core 21, in such a way that the optical properties of the photonic wire 20 are substantially isotropic in the XY plane.

The cladding 25 preferably extends over the entire height of the photonic wire 20. It may coat the core 21 fully or partially in the XY plane. The maximum radial dimension of the cladding 25 starting from the core 21 may be constant along the Z axis, particularly in the case in which it is produced by electron beam-assisted PVD deposition (EBPVD) at glancing incidence along the principal transverse axis $At_g$. Glancing incidence is intended to mean that the material of the cladding 25 is deposited along a deposition direction which is parallel to the principal transverse axis $At_g$ and forms an angle of inclination with respect to the XY plane which is less than 90°, and preferably less than or equal to 20°. As a variant, as described below (cf. FIG. 7), it may have a maximum radial dimension, starting from the core 21, which increases when approaching the substrate 10, particularly in the case in which it is produced by lithography and etching of a dielectric layer for encapsulation of the core 21.

The cladding 25 of the photonic wire 20 is produced on the basis of a material with a low refractive index $n_g$, that is to say a refractive index less than the refractive index $n_c$ of the core 21, here made of a silicon oxide with an index $n_g$ equal to 1.5, or of a silicon nitride, an aluminum nitride, or equivalent. Thus, because of the large difference between the index $n_c$ of the core 21 and that $n_g$ of the cladding 25, the guided mode remains strongly confined in the core 21 of the photonic wire 20. The optical properties of the photonic wire 20 therefore remain essentially defined by the core 21 and are not perturbed by the presence of the cladding 25 and its asymmetry of revolution.

By way of example, in the case of depositing 200 nm of $SiO_2$ by EBPVD at glancing incidence, and for a core 21 with a circular shape and a diameter of 200 nm in the plane of the quantum dot 24, the cladding 25 locally has an oblong shape with a length of 400 nm (maximum dimension) along the principal transverse axis $At_g$ and a width of 200 nm.

The correction device 50 is adapted to induce by electrostatic effect a mechanical deformation of the photonic wire 20 in an XY plane parallel to the substrate 10, along a deformation axis Ad forming an angle of inclination with respect to the transverse axis of the cladding 25 of between 0° and 90°, these values being exclusive, preferably between 20° and 70°, and advantageously between 30° and 40°.

The emitter 24 then experiences mechanical strains such that the energy separation S can be adjusted and reduced in a controlled way, thus making it possible to maximize the polarization entanglement of the pair of photons emitted. This deformation axis Ad is preferably aligned with one of the optical axes x, y of the optical dipoles $d_x$ and $d_y$ associated with the excitonic transitions. In this example, the deformation axis Ad is oriented along the optical axis x of the dipole $d_x$, which is oriented along X in the XYZ coordinate system (FIG. 2B). The deformation $\varepsilon_{XX}$ is oriented along the x axis of FIG. 2B, and the deformation $\varepsilon_{YY}$ is oriented along the y axis.

To this end, the correction device 50 comprises at least two electrodes 51 which are adapted to generate a nonuniform electric field and thus to generate an electrostatic force which is applied to the photonic wire 20, leading to the mechanical deformation thereof in the XY plane.

The electrodes 51 are arranged on either side of the photonic wire 20 in the XY plane and are disposed with respect to the photonic wire 20 in such a way that the latter has a distance $D_p$ from one 51p of the electrodes 51 which is less than the distance $D_d$ from the other electrode 51d. The proximal electrode 51p describes the electrode closest to the photonic wire 20, and the distal electrode 51d describes the electrode furthest away.

The deformation axis Ad, which corresponds to the orientation of the electrostatic force applied to the photonic wire 20 by the nonuniform electric field, passes to a first approximation through an end of the proximal electrode 51p oriented toward the photonic wire 20 and through the principal axis Δ.

Preferably, at least the proximal electrode 51p (and here both electrodes 51) has a shape which is pointed in the XY plane, the tip being oriented toward the photonic wire 20. A nonuniform electric field may then be generated. The electrodes 51 are produced from an electrically conductive material, for example gold, with a thickness of approximately 200 nm.

The electrodes 51 are arranged on an upper plane surface of pillars 53 which rest on the substrate 10. The pillars 53 have a height preferably substantially equal to that of the photonic wire 20, and are produced on the basis of the same crystalline material as the core 21 of the photonic wire, namely GaAs here. They have a local diameter in contact with the substrate 10 preferably at least equal to several hundreds of nanometers, for example greater than or equal to 2 μm or more. The pillars 53 have a substantially planar upper surface along the Z axis. It may comprise a portion of an antireflection layer 26. Thus, the electrodes 51 are substantially coplanar with the upper end of the photonic wire 20, to within the difference constituted by the antireflection layer 26. This antireflection layer 26 may fulfill a function of electrical insulation between the electrodes 51 and the pillars 53.

Furthermore, the correction device 50 comprises an electrical voltage source which is connected to the electrodes 51 and is adapted to apply a DC electrical voltage U, the value of which is predefined in such a way that the polarization entanglement of the emitted photons is obtained. This value is preferably determined during a prior calibration step. The voltage source may be connected to the electrodes 51 by electrical wires of the gold or carbon nanowire type.

Thus, during operation, the correction device 50 applies a DC electrical voltage U with a predefined value to the electrodes 51. The electrodes 51 then generate a nonuniform electric field, inside which the photonic wire 20 is located. The photonic wire 21 is then polarized, which leads to the formation of an electrostatic force oriented in the direction of the proximal electrode 51p. The photonic wire 20 then deforms under the effect of this electrostatic force along the deformation axis Ad. More precisely, the upper end of the photonic wire 20 experiences a nonzero displacement δ in the direction of the proximal electrode 51p along the deformation axis Ad.

This displacement δ generates a mechanical strain field with deformations $\varepsilon_{XX}$ and $\varepsilon_{YY}$ in the quantum dot 24. Because the principal transverse axis $At_g$ of the cladding 25 is inclined with respect to the deformation axis Ad of the photonic wire 20 (which is substantially collinear with the orientation of the electrostatic force), the strain tensor associated with the quantum dot 24 entails deformations $\varepsilon_{XX}$ and $\varepsilon_{YY}$ whose difference is always nonzero, the value of this difference being correlated with the strength of the applied electrical voltage U. This nonzero difference $\varepsilon_{XX}-\varepsilon_{YY}$ thus makes it possible to adjust and reduce, or even cancel, the energy separation S of the emitter 24, thus improving the degree of entanglement of the photon pair.

As indicated above, the deformation $\varepsilon_{XX}$ is oriented along the deformation axis Ad (and here along the x axis), and the deformation $\varepsilon_{YY}$ is oriented orthogonally to the deformation axis Ad. These deformations $\varepsilon_{XX}$ and $\varepsilon_{YY}$ are parallel to the XY plane. Here, the deformation $\varepsilon_{XX}$ is advantageously oriented along the optical axis x of the optical dipole $d_x$ associated with the excitonic transitions $X_x$, and the deformation $\varepsilon_{YY}$ is then oriented along the optical axis y of the optical dipole $d_y$ associated with the excitonic transitions $X_y$, thus improving the efficiency of modification of the value of the energy separation S.

Figure 3B:
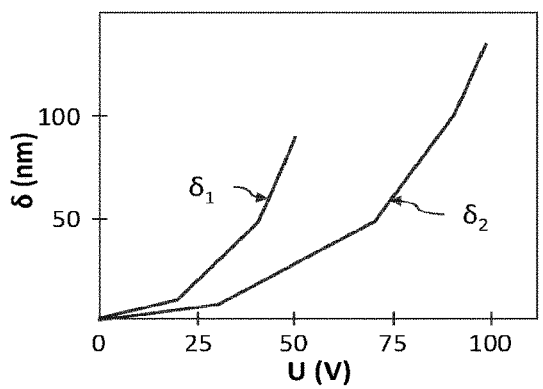
FIG. 3B illustrates an example of development of a displacement δ of the upper end of the photonic wire in an XY plane as a function of an applied electrical voltage U, in the case of a photonic wire formed by a core not coated with a cladding and in the case of a photonic wire formed by a core and a cladding with asymmetry of revolution.

FIG. 3B illustrates an example of development of the displacement δ of the photonic wire 20 in the XY plane, and more precisely of the displacement of the upper end 21.2, as a function of the applied electrical voltage U, in the case in which the photonic wire 20 comprises ($δ_2$) or does not comprise ($δ_1$) the cladding 25 with asymmetry of revolution as described above.

In this example, the photonic wire 20 comprises a core 21 made of GaAs with a circular cross section, with a diameter of 200 nm in contact the substrate 10 and a diameter of 3.5 μm at the top, and a height of 20 μm. An InAs quantum dot 24 is placed substantially on the principal axis Δ, at a height of 100 nm above the reflective layer 12. The photonic wire 20 comprises or does not comprise a cladding 25 produced from SiO₂ deposited by directional PVD around the core 21 along the principal transverse axis $At_g$, with an oblong shape having a length (maximum dimension) of 400 nm and a width of 200 nm.

The two pointed electrodes 51 are spaced apart from one another by a distance of 4760 nm (distance between the tips), and, in the absence of displacement of the photonic wire 20, the center of the core 21 is located at a distance of 2040 nm from the proximal electrode and 2720 nm from the distal electrode.

It is found therefrom that the displacement δ increases greatly with an increase in the electrical voltage U. Thus, in the absence of the cladding 25 ($δ_1$), the photonic wire 20 (core 21 made of GaAs only) is displaced by a value of approximately 80 nm along the deformation axis Ad for a value of approximately 50 V. In the presence of the cladding 25 ($δ_2$), conversely, the photonic wire 20 is displaced by the same value of 80 nm for an electrical voltage of approximately 85 V, which signifies that the cladding 25 with asymmetry of revolution induces a modification of the mechanical behavior of the photonic wire 20.

Figure 3C:
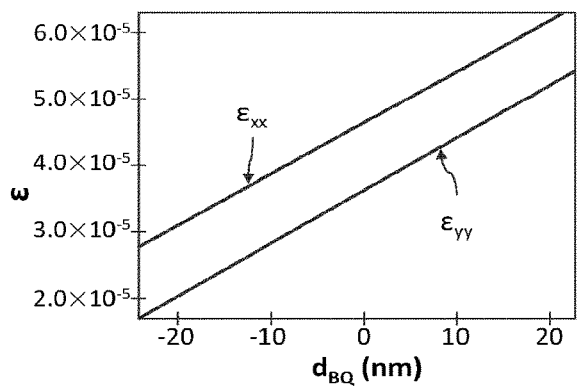
FIG. 3C illustrates an example of development of the deformations $ε_{XX}$ and $ε_{YY}$ experienced by a quantum dot in an XY plane as a function of its transverse position $d_{BQ}$ with respect to the principal axis Δ, the quantum dot being located in a photonic wire formed by a core and a cladding with asymmetry of revolution, when the upper end of the photonic wire has been displaced in the XY plane.

FIG. 3C illustrates an example of development of the deformations $\varepsilon_{XX}$ and $\varepsilon_{YY}$ associated with the strain tensor of the quantum dot 24 as a function of the position $d_{BQ}$ thereof in the XY plane, starting from the principal axis Δ ($d_{BQ}$=0). The photonic wire 20 and the electrodes 51 are dimensioned in an identical way to the example of FIG. 3B. The photonic wire 20 is deformed by electrostatic effect because of the nonzero electrical voltage U, here equal to 70 V.

It may be seen that the deformations $\varepsilon_{XX}$ and $\varepsilon_{YY}$ are nonzero whether the quantum dot 24 is arranged on the principal axis Δ or whether it is at a distance from the latter. Furthermore, the difference between these deformations $\varepsilon_{XX}$ and $\varepsilon_{YY}$ is nonzero and takes a value of $10^{-5}$ here, which may be sufficient to cancel the energy separation S of the quantum dot 24 and thus contribute to maximizing the degree of entanglement of the pair of photons emitted. It is therefore possible to reduce the energy separation S associated with the quantum dot 24 even though the latter is placed on the principal axis Δ. This positioning on the principal axis Δ, to within 20 nm, furthermore contributes to improving the degree of entanglement of the photon pair by making the lifetimes of the excitons $X_x$ and $X_y$ substantially the same.

Figure 3D:
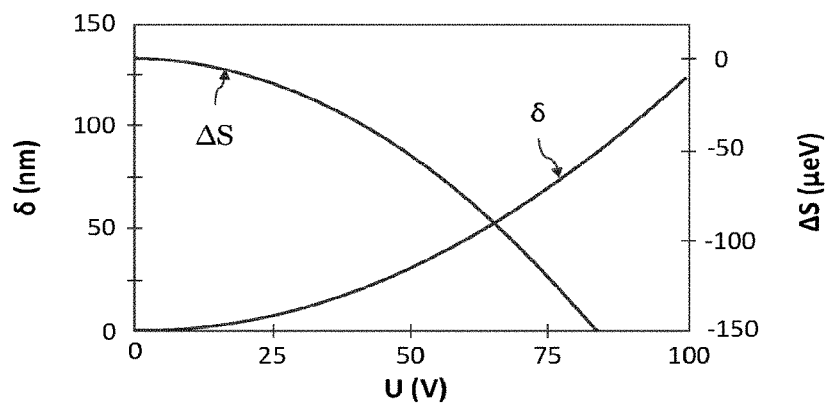
FIG. 3D illustrates an example of development of the displacement δ in an XY plane of the upper end of a photonic wire formed by a core and a cladding with asymmetry of revolution, on the one hand, and the difference ΔS of the energy separation S with respect to the value $S_0$ without strain, as a function of the applied electrical voltage U.

FIG. 3D illustrates an example of development of the displacement δ of the upper end of the photonic wire 20 in the XY plane and along the deformation axis Ad as a function of the electrical voltage U, and also illustrates the development of a difference ΔS of the energy separation S of the quantum dot 24 with respect to its initial value $S_0$ (without strain). The photonic wire 20 and the electrodes 51 are dimensioned in an identical way to the example of FIGS. 3A and 3B. In this example, the quantum dot 24 has a value $S_0$ of 50 μeV. The development of the difference ΔS of the energy separation S from the initial value $S_0$ as a function of the applied electrical voltage was obtained here by simulating the displacement of the top of the wire and the deformation field which it induces at the base of the photonic wire with the aid of the COMSOL Multiphysics software, and by applying the formulation set out in the article by Trotta et al. 2015 in order to deduce the development of the energy separation S therefrom. During calibration or use of the source, however, the development of the energy separation S may be obtained simply by measuring (by luminescence spectroscopy) the energy of the photons associated with the excitonic transitions $X_x$ and $X_y$ to the ground state G as a function of the voltage U. The energy separation S is approximately canceled when the energy peaks associated with these photons cannot be separated in the luminescence spectrum.

It may be seen that, for a voltage ranging from 0 V to 100 V, the electrostatic force induces a displacement δ of the photonic wire 20 in the XY plane ranging approximately from 0 nm to 125 nm along the deformation axis Ad. The values of the deformations $\varepsilon_{XX}$ and $\varepsilon_{YY}$ experienced by the quantum dot 24, and more precisely the difference ($\varepsilon_{XX}-\varepsilon_{YY}$) between the deformations $\varepsilon_{XX}$ and $\varepsilon_{YY}$, make it possible to vary the energy separation S. Here, it has a value of 50 μeV for a voltage of zero (and a zero applied strain), decreases as the electrical voltage increases until it is canceled for an electrical voltage of approximately 48 V, then increases up to 100 μeV for an electrical voltage of approximately 100 V. Thus, with the application of a voltage of approximately 48 V, the energy separation S is canceled so that total entanglement of the pair of photons emitted is then obtained (the quantum dot 24 being located on the principal axis Δ).

Thus, the light source 1 according to the invention makes it possible to adjust in a controlled way the value of the energy separation S of the emitter 24, here of the quantum dot 24 (to better than within the width of the emission lines) and thus to reduce it as far as canceling it with the aim of maximizing the degree of polarization entanglement of the pair of photons emitted. As described above, this is obtained by the combination of, on the one hand, the anisotropy of the mechanical properties of the photonic wire 20 because of the cladding 25 with asymmetry of revolution because of the principal transverse axis $At_g$, without the optical properties of the photonic wire 20 (which are defined by the properties of the core 21) being modified by the cladding 25, and on the other hand the deformation of the photonic wire 20 by electrostatic effect along a deformation axis Ad which is inclined with respect to the principal transverse axis $At_g$. Furthermore, the emitter 24 is advantageously located on the principal axis Δ so that the lifetimes of the excitons $X_x$ and $X_y$ are substantially equal, also making it possible to maximize the degree of entanglement of the photon pair.

The light source 1 comprises an optical excitation device 30 adapted to cause the spontaneous emission of a pair of photons by the quantum dot 24 in response to an excitation signal (here a laser pulse), and preferably comprises a collection device 40 adapted to collect the signal (pair of photons) emitted by the emitter 24 in response to the excitation laser pulse and extracted from the photonic wire 20 along the +Z direction.

Figure 4A:
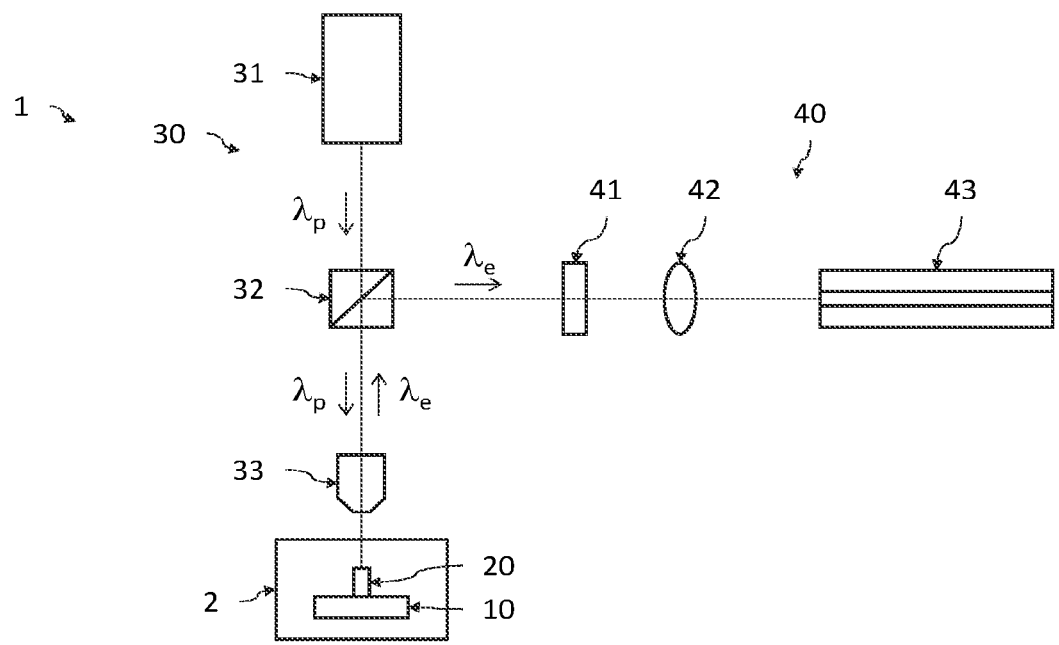
FIG. 4A is a partial schematic view of a light source comprising an optical excitation device and a collection device according to one embodiment.

FIG. 4A partially and schematically illustrates an example of the optical excitation device 30 and of the collection device 40, for which the optical excitation path and the optical collection path do not coincide.

The optical excitation device 30 comprises a laser source 31 adapted to emit a so-called excitation or pumping signal (laser pulse) at the excitation (or pumping) wavelength $\lambda_p$, making it possible to form two electron-hole pairs in the emitter 24. Expediently, the energy of a laser photon will be equal to one half of the energy difference between the biexcitonic state XX and the ground state G of the emitter, in order to make it possible to prepare the state XX for example by the known technique of nonlinear two-photon absorption. This expedient approach makes it possible, in particular, to obtain a high spectral finesse of the excitonic lines, a property which is important when wishing for the pairs of photons to be both entangled and indistinguishable. It is, however, also possible to generate pairs of entangled photons on demand by using a laser whose energy per photon is greater than the bandgap of the anchoring layer (for example, $\lambda_p$=840 nm for InAs quantum dots in GaAs) or of the material constituting the barrier of the quantum dot (for example, $\lambda_p$=810 nm for GaAs). The laser source may be a titanium-sapphire laser whose wavelength $\lambda_p$ is, for example, tunable in the range 1000 nm-750 nm. The repetition rate may be approximately 80 MHz or more (a few GHz), and the typical width of the laser pulses may be of the order of one picosecond or less.

In this example, the optical path of the laser pulses is defined by optics (not represented) in such a way that the excitation signal is incident on the core 21 of the photonic wire 20 collinearly with the principal axis Δ. The excitation signal passes through a semireflective plate 32, then a confocal microscope 33, which focuses the excitation signal onto the core 21 of the photonic wire 20.

So that the emitter 24 has a spectrally fine emission, the photonic wire 20 and the substrate 10 are preferably arranged in a cryostat 2 so as to bring the temperature to a value preferably below a few tens of kelvin.

The emitted photons are extracted from the photonic wire 20 along the principal axis Δ through the upper end 21.2 and are oriented along the +Z direction, then transmitted by the confocal microscope 33, reflected by the semireflective plate 32 and collected by the collection device 40, which here establishes optical coupling between the photonic wire 20 and, here, an external waveguide 43.

On the collection optical path, downstream of the semireflective plate 32, the collection device 40 advantageously comprises at least one spectral filter 41 for filtering the excitation signal, particularly in the case in which the photonic wire 20 comprises a plurality of quantum dots 24 which are located in the same anchoring layer. The spectral filter 41 may comprise a diffraction grating and have a resolution of 0.1 nm, for example. Thus, the spectral filter 41 makes it possible to select the photons associated with the different excitonic transitions and to filter the excitation signal. It is generally possible to identify a particular quantum dot 24, preferably the one arranged closest to the longitudinal axis. This is because such a quantum dot 24 has a high spontaneous emission rate, as indicated particularly in the article by Claudon et al. entitled *A highly efficient single-photon source based on a quantum dot in a photonic nanowire* Nat. Photonics, 4, 174 (2010).

The collection device 40 here comprises a lens 42 making it possible to focus the emitted signal onto the input of an external waveguide 43, for example an optical fiber. The optical fiber 43 may then be connected to a photodetector, for example an avalanche photodetector, or to any other optical and/or electronic device, depending on the desired application of the light source 1.

It may, however, be advantageous to separate the optical path of the excitation signal entirely from the optical path of the signal emitted by the photonic wire 20.

Figure 4B:
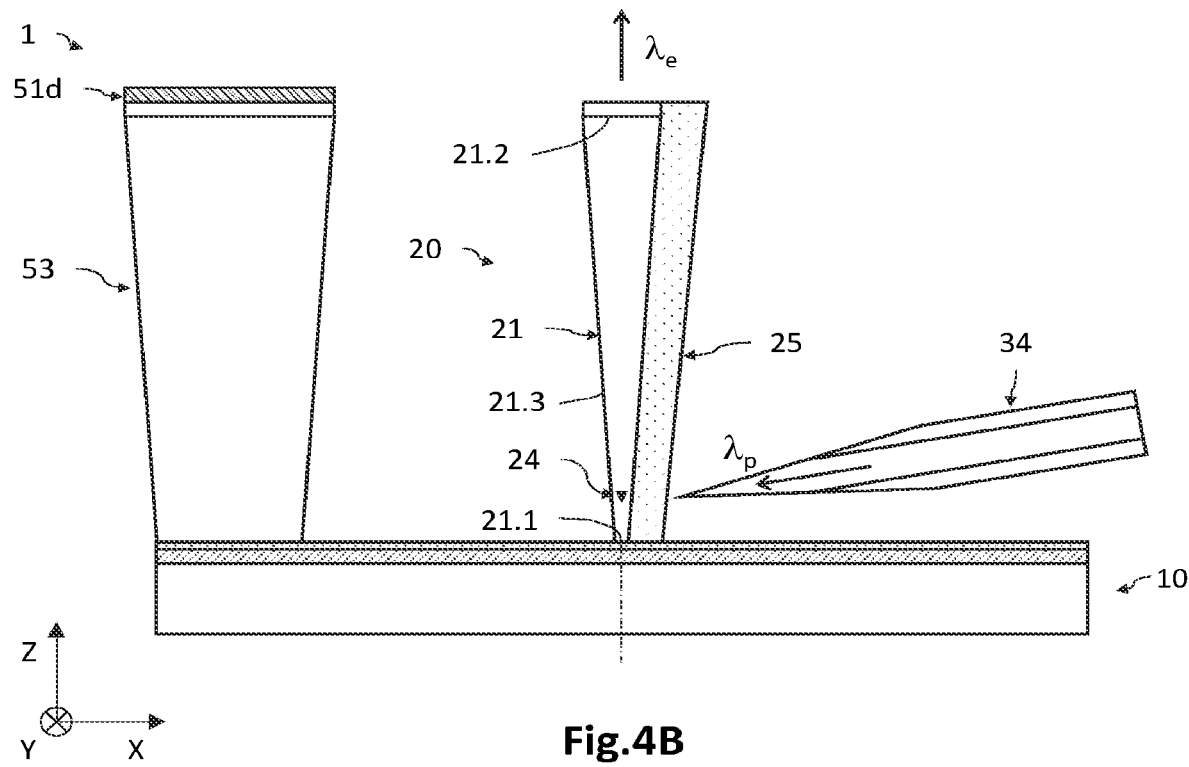
FIG. 4B is a partial schematic view of a light source comprising an optical excitation device according to an alternative embodiment.
Figure 5A:
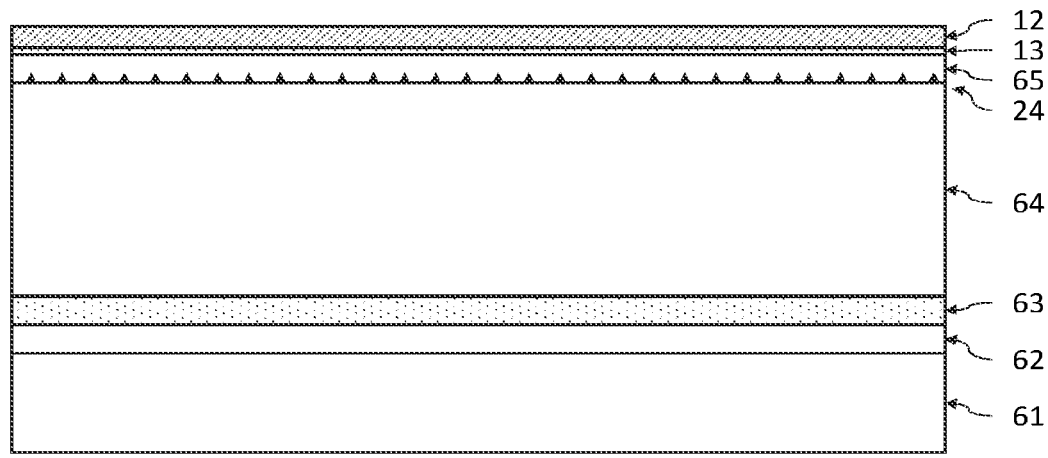
FIGS. 5A to 5F illustrate various steps of a method for manufacturing a light source according to an embodiment similar to the one illustrated in FIGS. 2A and 2B.
Figure 5B:
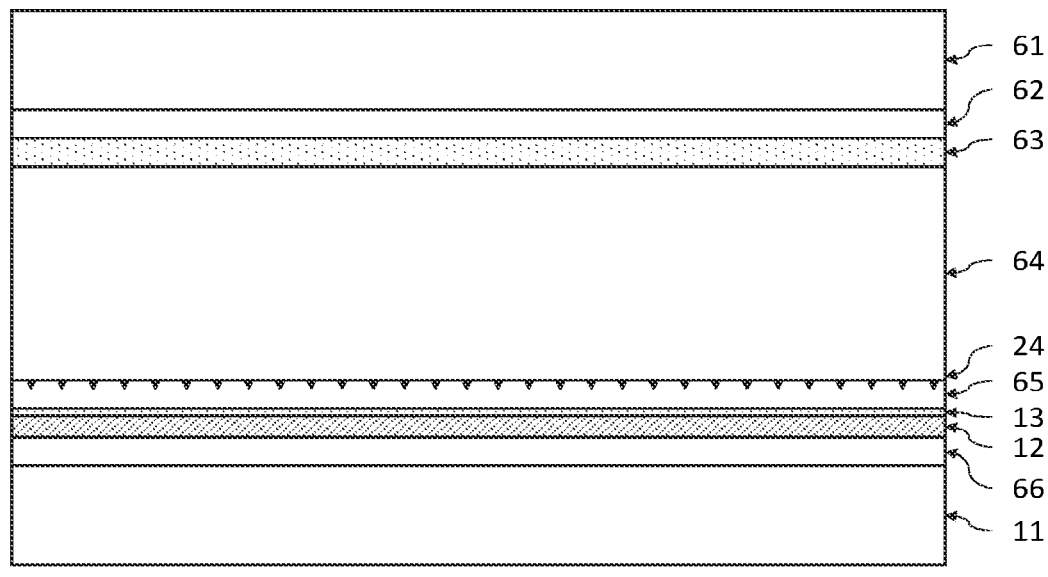
Figure 5C:
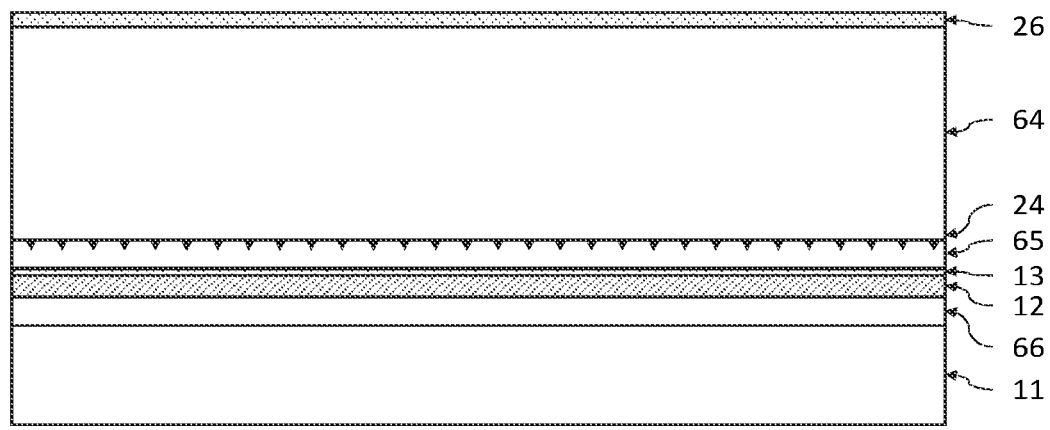
Figure 5D:
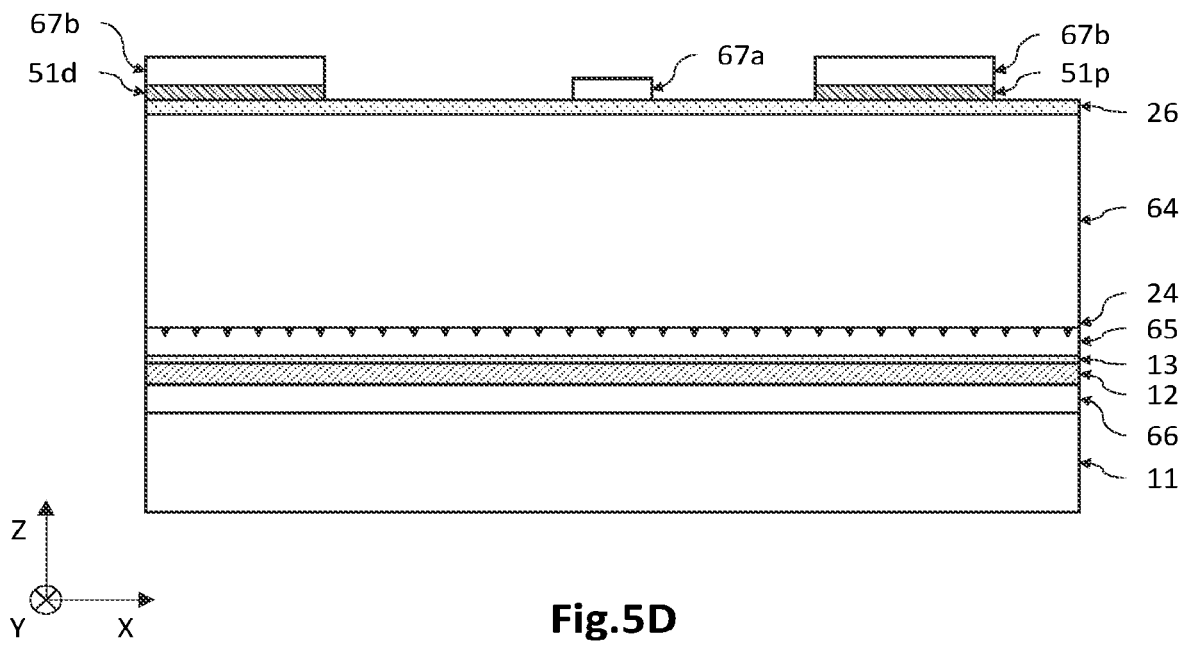
Figure 5E:
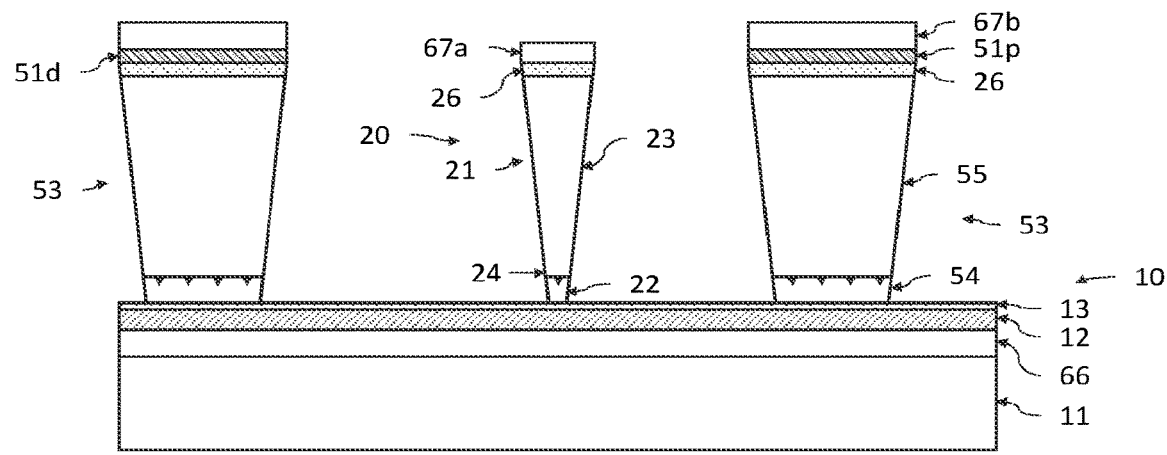
Figure 5F:
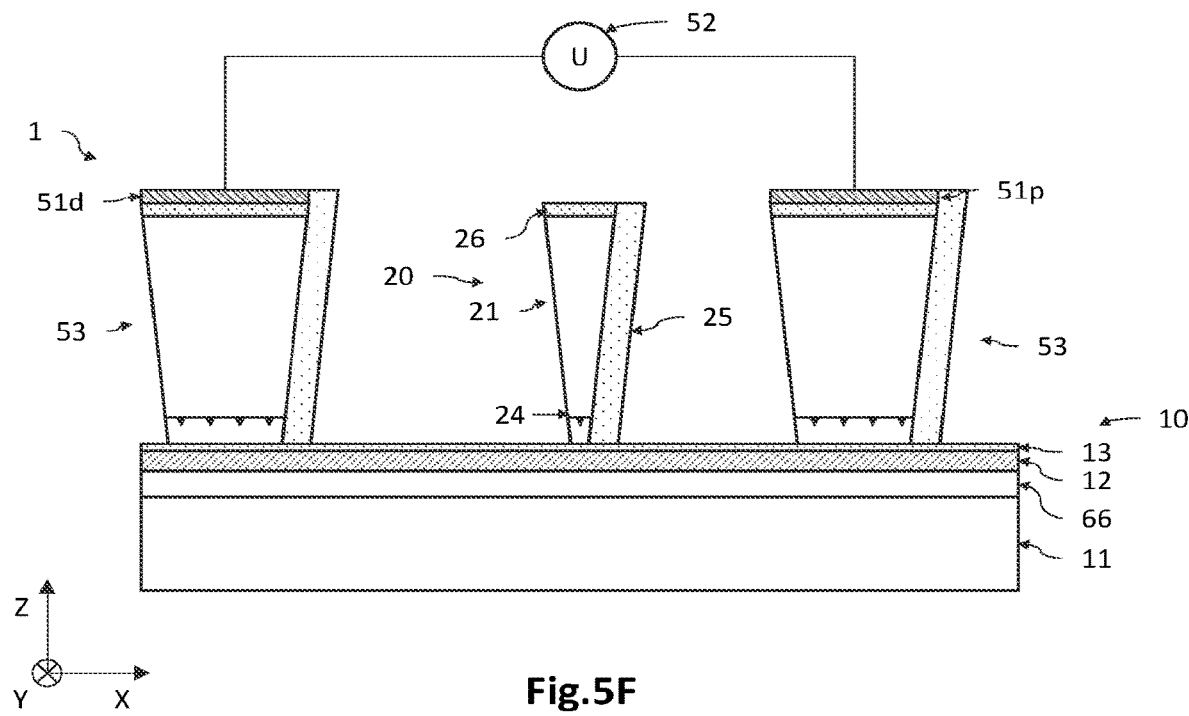

In this regard, FIG. 4B partially and schematically illustrates another example of the optical excitation device 30 and of the collection device 40, for which the excitation optical path and the collection optical path are entirely separated.

The optical expectation device 30 thus comprises a waveguide 34 which is coupled to the laser source 31 and the emission end of which is arranged in proximity to and in the direction of the emitter 24 of the photonic wire 20, at a nonzero angle with respect to the principal axis Δ, for example an angle greater than or equal to 45° and advantageously close to 90°. Thus, the excitation signal (laser pulse) is transmitted in the direction of the quantum dot 24 through the lateral border 21.3 of the core 21 of the photonic wire 20, and not through the upper end 21.2 and collinearly with the principal axis Δ. In the example of FIG. 4B, the waveguide 34 is a waveguide whose end is tapered (its transverse dimensions decrease in the direction of its emission end). Such an optical fiber (tapered optical fiber) may be placed in the vicinity of the photonic wire 20 by a micromanipulator, to within a fraction of a micron, then fixed to the substrate 10, for example by means of an adhesive material (glue).

The collection device 40 may then be similar to the one illustrated in FIG. 4A. This configuration greatly reduces the probability that the collection device 40 may collect a part of the excitation signal which has been scattered by the photonic wire 20. By furthermore using the technique of resonant two-photon excitation in order to excite a single quantum dot selectively, it is then possible to remove the spectral filter 41 and avoid the optical losses which it induces. The efficiency of the light source 1 is thus optimized.

It should furthermore be noted that the light source 1 keeps the advantageous characteristics inherent to the single-mode photonic wires with a mode adapter. The photonic wire 20 has an emission diagram with a low numerical aperture, which allows efficient coupling to an external waveguide. Furthermore, it is possible to produce a wavelength-tunable light source 1 by applying an external field to the lower portion of the core 21 of the photonic wire 20 (for example an electric field or a mechanical strain field generated by a piezoelectric actuator), which modifies the bandgap energy of the semiconductor quantum dot 24 without affecting the degree of entanglement of the light source 1.

An example of a method for manufacturing the light source 1 according to one embodiment is now described with reference to FIGS. 5A to 5F, which illustrate various steps of the method.

During a first step (FIG. 5A), a stack of epitaxial layers is produced starting from a first substrate 61. The first substrate 61 is preferably produced from a crystalline material having a small lattice parameter difference with respect to the principal crystalline material of the photonic wire 20. In this example, the first substrate 61 is produced from GaAs. The layer epitaxy in question may be molecular beam epitaxy (MBE) or metalorganic chemical vapor deposition (MOCVD), or any other equivalent epitaxy technique.

The stack is formed by the following layers arranged on one another, starting from the first substrate 61:
  a layer 62, referred to as a buffer layer, of GaAs with a thickness of approximately 500 nm, deposited in contact with the first substrate 61;
  a sacrificial layer 63, for example produced on the basis of AlAs, here $Al_{1-x}Ga_xAs$ with a low gallium content ($x_{Ga}$ less than or equal to 0.4), with a thickness of approximately 500 nm;
  a layer 64 of the high-index crystalline material of the photonic wire 20, here of GaAs, with a thickness corresponding to a desired height $h_2$ of the upper part, for example approximately 12 μm;
  an active layer formed by an anchoring layer with a thickness of 0.5 nm produced from the semiconductor compound forming the quantum dots, for example from InAs, and from the quantum dots 24 (only the quantum dots are represented, here by triangles);
  a layer 65 of the high-index crystalline material, here from GaAs, intended to form the lower part, for example with a thickness of approximately 100 nm.

The active layer is produced according to the technical knowledge of the person skilled in the art, for example according to the conditions described in the article by Gérard et al. entitled *Optical investigation of the self-organized growth of InAs/GaAs quantum boxes*, J. Crystal Growth, 150, 351 (1995). It may have a thickness of the order of 0.5 nm and comprise quantum dots arranged in the XY plane with a surface density equal, for example, to 200 quantum dots per micron.

The reflective layer 12 is then produced starting from the free face of the stack. To this end, the stack is coated with a dielectric layer 13, which is produced from a material which is dielectric on the one hand, and inert with respect to an etching agent subsequently used during a step of producing the photonic wire 20 of the pillars 53. The dielectric layer 13 may be a silicon nitride, for example $Si_3N_4$, with a thickness of approximately 10 nm. The dielectric layer 13 is subsequently coated with a layer 12 which is reflective at the wavelength of the photons emitted by the light source 1. The reflective layer 12 may be produced from a metallic material such as gold, with a thickness of approximately 100 nm to 300 nm.

During a subsequent step (FIG. 5B), the stack is fixed to a second substrate 11. To this end, the free face of the reflective layer 12 is placed in contact with an adhesive layer 66 produced from an adhesive material which coats the second substrate 11. The latter may be produced from an optionally semiconductor crystalline material, for example doped or undoped GaAs. The adhesive layer 66 may be produced from an epoxy glue, or from a polymer such as a resin for optical lithography. Any other fixing technique may be used. The substrate 10 on which the photonic wire 20 is intended to rest is then formed by the second substrate 11, the adhesive layer 66, the reflective layer 12 and the dielectric layer 13.

During a subsequent step (FIG. 5C), the stack is thinned so as to expose one face of the layer 64 of GaAs. To this end, the first substrate 61 is for example thinned by mechanical or chemical-mechanical polishing until a GaAs thickness of between approximately 50 μm and 100 μm remains. Chemical etching of the thinned first substrate 61 and of the buffer layer 62 is then carried out with an etching agent which is selective with respect to the sacrificial layer 63. Lastly, chemical etching of the sacrificial layer 63 is carried out with an agent which is selective with respect to the principal crystalline material, for example by etching with HF (hydrofluoric acid). A free face of the layer 64 of GaAs which has good optical properties (low roughness) is thus obtained, thereby minimizing the possible optical losses at this face.

Next, an antireflection layer 26 is deposited on the free face of the layer 64 of GaAs. This antireflection layer 26 has a refractive index $n_{ar}$ which is close to $\sqrt{n}$ (n being the refractive index of the high index crystalline material, here GaAs) and a thickness equal to one fourth of the wavelength, i.e. $\lambda_e/(4n_{ar})$. It may for example be produced from a silicon nitride, for example $Si_3N_4$, deposited by PECVD epitaxy.

During a subsequent step (FIG. 5D), the electrodes 51p, 51d, which are arranged here on the antireflection layer 26, are produced. They may be produced by a conventional lift-off method, for example by electron beam lithography of a mask (for example made of PMMA) deposited on the antireflection layer 26, deposition of a layer of gold with a thickness of 200 nm, then removal of the mask by chemical attack. The electrodes 51p, 51d forming the desired pointed pattern are thus obtained.

The arrangement of the electrodes 51p, 51d, and in particular of the proximal electrode 51p, with respect to the photonic wire defines the deformation axis Ad, which is preferably aligned along one of the optical axes x or y of the optical dipoles associated with the excitonic transitions. A prior study by optical spectroscopy of the quantum dots located in the zone intended for the formation of the core 21 before etching may be carried out in order to identify the orientation of the optical axes x and y in the XY plane. These optical axes x and y may generally be aligned with the intrinsic crystallographic axes of the emitter 24 in the XY plane, although they may also have a misalignment. Thus, this identification of the orientation of the optical axes x and y by spectroscopy then makes it possible to orientate the deformation axis Ad along one of the optical axes x and y and thus to make the modification of the energy separation S by the correction device 50 more efficient by generating deformations $\varepsilon_{XX}$ and $\varepsilon_{YY}$ which are actually aligned with the optical axes x and y.

Next, an etching mask 67 intended for the formation of the core 21 of the photonic wire 20 and of the pillars 53 is produced so as to cover the electrodes 51 as well as a part of the antireflection layer 26. The etching mask 67 is produced here from nickel Ni by lithography and lift-off. It thus comprises a central part 67a intended for the formation of the core 21 of the photonic wire 20, the dimensions of which in the XY plane define that of the upper end of the core 21 of the photonic wire 20, here resting in contact with the antireflection layer 26. It also comprises a plurality of lateral parts 67b intended for the formation of the pillars 53, here resting in contact with the electrodes 51.

The central part 67a of the etching mask 67 may have a shape which makes it possible to obtain a core 21 having the desired cross-sectional shape, i.e. with symmetry of rotation of order 4 about the principal axis Δ, for example square, octagonal or circular. Here, it is circular and has a diameter $d_{pc}$ which depends on the etching angle α, which corresponds to the angle of inclination formed by the orientation of the lateral border of the core 21 of the photonic wire 20 with respect to the Z axis and by the desired height h of the photonic wire 20. Given that the local diameter of the core 21 of the photonic wire 20 in the plane of the quantum dot 24 is intended to be substantially equal to $d_{bq}=\lambda_e/n$ at a height of the order of 100 nm above the substrate 10, the diameter of the central part is substantially equal to $d_{bq}+2\times h\times\tan(\alpha)$. It is assumed here that the height of 100 nm of the quantum dot 24 with respect to the substrate 10 is negligible in relation to the total height h of the photonic wire 20.

The dimensions of the lateral parts 67b of the etching mask 67 in the XY plane are selected as a function of the etching angle α and of the desired width of the pillars 53 at the lower end of the pillars 53 in contact with the substrate 10. By way of example, for a pillar 53 whose width in contact with the substrate 10 is equal to approximately 1 μm, and for a height of approximately 12 μm, the lateral dimension of the lateral parts 67b is substantially equal to approximately 2.25 μm.

During a subsequent step (FIG. 5E), localized etching of the antireflection layer 26 is carried out in order to remove the parts not coated with the etching mask 67. The etching may, for example, be carried out by reactive ion etching (RIE), and preferably in such a way that the etched edges of the antireflection layer 26 are substantially oriented along the Z axis. Thus, the layer 64 of GaAs has an upper face with a free surface, that is to say one which is not coated with the antireflection layer 26 and with the etching mask 67.

Next, the core 21 of the photonic wire 20 as well as the pillars 53 are produced, here by localized etching of the stack. The etching may be carried out by reactive ion etching (RIE), the characteristics of which in terms of physical etching and chemical etching are defined so as to obtain the desired etching angle α, for example approximately 3°. The dielectric layer 13 forms an etch stop layer. The etching agent thus etches a part of the layers of GaAs in the XY plane. The core 21 of the photonic wire 20 is thus obtained, which contains one or more quantum dots 24 at a height of approximately 100 nm, for which the local diameter is substantially equal to approximately 200 nm. The photonic wire 20 extends continuously along the Z axis between the antireflection layer 26 and the substrate 10. The pillars 53, which have the desired transverse dimensions at the level of the contact with the substrate 10, are also obtained. The antireflection layer 26 covers the upper faces of the core 21 of the photonic wire 20 and of the pillars 53 continuously. After this step, the etching mask 67 is removed, for example with the aid of an acid solution.

During a subsequent step (FIG. 5F), the electrical contact between the electrical voltage source 52 and the electrodes 51 is produced, for example by welding of wires made of an electrically conductive material, for example gold or carbon. The cladding 25 with axial asymmetry is then produced, here by EBPVD deposition of a dielectric material with a low refractive index directionally and at controlled incidence. The GLAD (Glancing Incidence Deposition) method described in particular in the article by Robbie & Brett entitled *Sculptured thin films and glancing angle deposition: Growth mechanics and applications*, J. Vac. Sci. Technol., A 15, 1460 (1997) may be used. The dielectric material may be selected from a silicon oxide (for example $SiO_2$), a silicon nitride (for example $Si_3N_4$) and an aluminum oxide (for example $Al_2O_3$), and a thickness of several hundreds of nanometers, for example 250 nm, may be deposited. The electrical contact is preferably produced before the deposition of the cladding 25, although the converse remains possible.

In this example, the photonic wire 20 may comprise a plurality of quantum dots 24 located in the same XY plane. This is because the cross section in which the quantum dots are located has an area of the order of 0.04 μm² and the density of quantum dots is of the order of 200/μm². The result of this is that there are on average 8 quantum dots in the core 21 of the photonic wire 20, spatially distributed randomly in the same cross section. These quantum dots may thus be arranged at different distances from the longitudinal axis Δ, and they emit photons at different wavelengths from one quantum dot 24 to another because of the variability of the size of the quantum dots obtained by epitaxy. In this case, as described above, the collection device of the light source 1 advantageously comprises a spectral filter (cf. FIG. 4A) so as to isolate the photons emitted by a selected quantum dot 24, preferably the one closest to the longitudinal axis Δ insofar as it has the highest spontaneous emission rate among the quantum dots present and ensures a substantially equal lifetime of the excitonic states $X_x$ and $X_y$.

A light source 1 is thus obtained which is adapted to emit pairs of polarization-entangled photons, comprising a photonic wire 20 formed by a single-mode core 21 which supports an optical mode which is degenerate in polarization and is coated at least partially with a cladding 25 having axial asymmetry. The correction device 50 is adapted to generate an electrostatic force generating mechanical strains in the emitter 24, the values of which ensure a reduction of the energy separation S as far as a value allowing the generation of pairs of entangled photons and optimization of the degree of entanglement.

Figure 6:
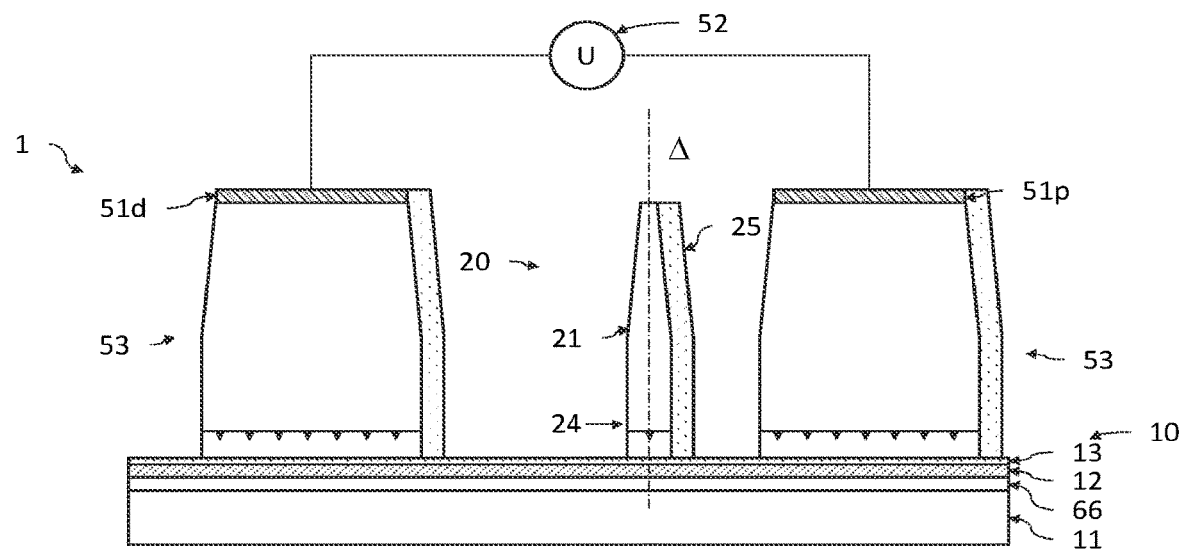
FIG. 6 is a partial schematic view in cross section of a light source according to another embodiment, in which the photonic wire has a tapered shape.

FIG. 6 is a partial schematic view in section of a light source 1 according to another embodiment, which differs from the one illustrated in FIGS. 2A and 2B essentially in that the photonic wire 20 comprises a core 21 of tapered longitudinal shape. Furthermore, the light source 1 does not comprise an antireflection layer 26.

The core 21 of the photonic wire 20 forms a single-mode waveguide for the pair of photons emitted by the emitter 24, and comprises a mode adapter optimizing the light extraction and making it possible to obtain an emission diagram of Gaussian shape with a low numerical aperture. In this example, the photonic wire 20 is produced on the basis of InP and comprises at least one semiconductor quantum dot 24 made of InAsP.

The core 21 of the photonic wire 20 here has a local diameter of close to $\lambda_e/n$, here for example approximately 200 nm, in the cross section containing the quantum dot 24. Here, the emitter 24 is located at a distance equal to approximately 100 nm from the substrate 10. In this example, it has a substantially constant local diameter along the principal axis Δ over a determined height, beyond which the local diameter decreases along the +Z direction.

The light source 1 according to this embodiment has the same advantages as those described above, which are not described in detail again here. The manufacturing method comprises steps similar to those described in the article by Claudon et al. entitled *Harnessing Light with Photonic nanowires: Fundamentals and Applications to Quantum Optics*, Chem Phys Chem, 14, 2393-2402 (2013), and to those described with reference to FIGS. 5A to 5F.

Figure 7:
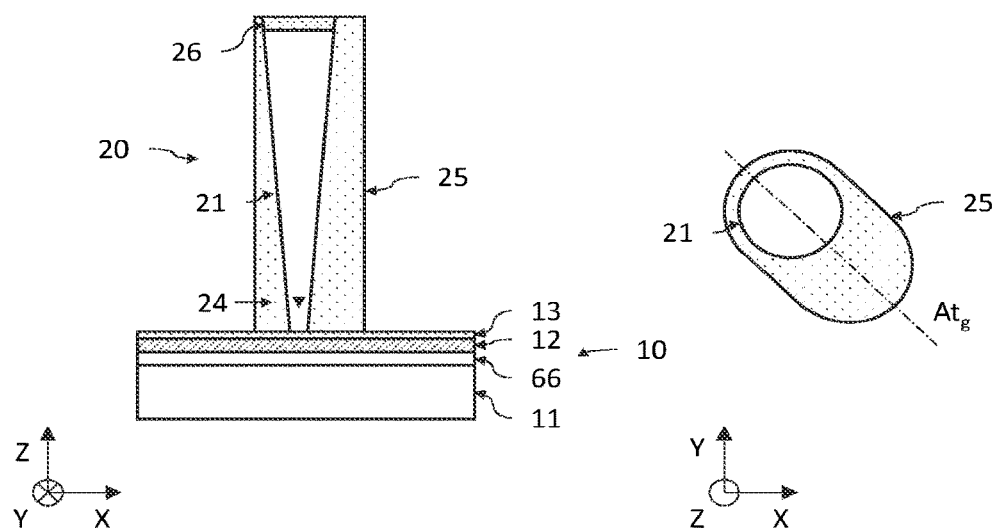
FIG. 7 is a partial schematic cross section (left) and top view (right) of a photonic wire according to an embodiment in which the asymmetrical cladding has been produced by lithography and etching of an initial encapsulation layer.

Thus, FIG. 7 partially and schematically illustrates a photonic wire 20 of a light source 1 according to an alternative embodiment. Here, the cladding 25 is not produced by directional PVD deposition at glancing incidence, but by lithography and etching of an encapsulation layer.

After the step 5E described above, an encapsulation layer is deposited on the substrate 10 so as to enclose the core 21 of the photonic wire 20 (and therefore also the pillars 53) fully in the XY plane. The encapsulation layer is produced from a material which has a low refractive index and is preferably dielectric. It may thus be a resin such as poly (methyl methacrylate) (PMMA). The asymmetrical cladding 25 is obtained by electron beam lithography then etching of the encapsulation layer. Thus, unlike the cladding 25 deposited by directional PVD, the cladding 25 here has a shape along the Z axis which does not follow the tapered or flared shape of the core 21 of the photonic wire 20. The photonic wire 20 (core 21 and cladding 25) then has a cross section with dimensions in the XY plane which are substantially constant along the Z axis.

Figure 8:
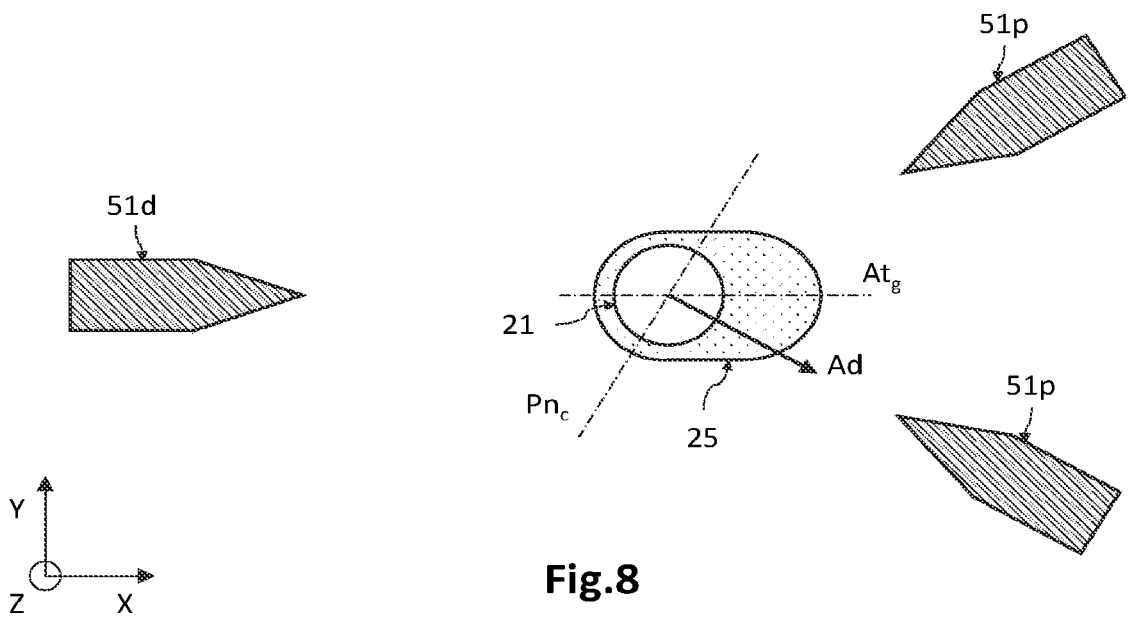
FIG. 8 is a partial schematic view, in top view, of light source according to an alternative embodiment comprising at least three electrodes.

FIG. 8 is a partial schematic top view of a light source 1 according to an alternative embodiment, in which the light source 1 differs from those described above essentially in that it comprises more than two electrodes 51, here three electrodes, although it may comprise more electrodes 51 (in particular more proximal electrodes 51p).

Here, the correction device 50 comprises one distal electrode 51d and two proximal electrodes 51p. The proximal electrodes 51p are located symmetrically with one another with respect to a plane passing through the principal axis Δ and through the tip of the distal electrode 51d. The two proximal electrodes 51p are preferably separated from the principal axis Δ by the same distance.

When only two electrodes are used, it is possible after manufacture that the optical dipoles associated with the excitonic transitions $X_x$ and $X_y$ are not exactly aligned with respect to the X axis along which the two electrodes 51 are aligned (and therefore not aligned with the deformation axis Ad). Here, by altering the polarization of the two proximal electrodes 51p, it becomes possible to define the orientation of the deformation axis Ad in the XY plane, this remaining different in the XY plane than the principal transverse axis $At_g$ of the cladding 25, and to orientate it along one or other of the optical axes x and y. The efficiency of the modification of the energy separation S by the correction device 50 is therefore improved.

Figure 9A:
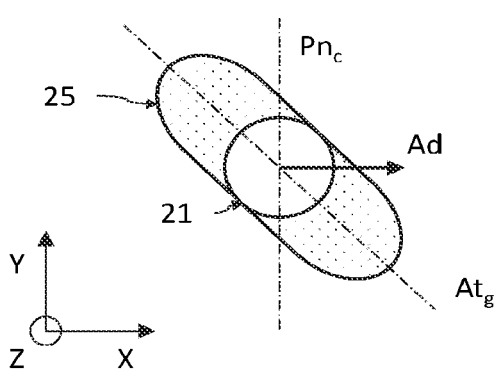
FIGS. 9A and 9B are partial schematic views, in top view, of a photonic wire in which the cladding with asymmetry of revolution has different configurations.
Figure 9B:
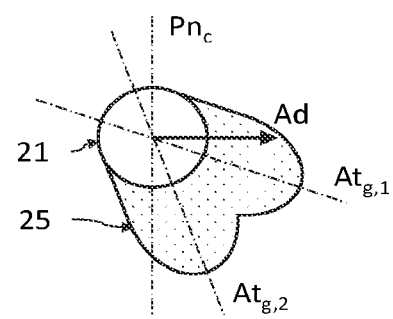

FIGS. 9A and 9B are partial schematic top views of two photonic wires according to alternative embodiments, which differ from one another by the shape of the cladding 25 with asymmetry of revolution.

In the example of FIG. 9A, the cladding 25 extends along the principal transverse axis $At_g$ on either side of the core 21. Here, it has a substantially identical length along the two directions of the principal transverse axis $At_g$. Here the deformation axis Ad forms an angle of inclination of between 20° and 70° with the principal transverse axis $At_g$.

In the example of FIG. 9B, the cladding 25 extends along two privileged transverse axes $At_{g,1}$ and $At_{g,2}$. These axes $At_{g,1}$ and $At_{g,2}$ are defined by the cladding 25 having a first maximum length along one axis $At_{g,1}$ and a second axial length along an axis $At_{g,2}$ which is not collinear with $At_{g,1}$. Whatever the case, at least one of the axes $At_{g,1}$ and $At_{g,2}$, and here both axes $At_{g,1}$ and $At_{g,2}$, form an angle of inclination of between 20° and 70° with the deformation axis Ad.

Particular embodiments have just been described. Different variants and modifications will be apparent to the person skilled in the art.

In one variant (not represented), it is possible to apply an electrical potential to the photonic wire 20. To this end, the core 21 comprises an upper end having a barrier layer made of an electrically insulating material, for example here $Ga_{0.2}Al_{0.8}As$, coated with a layer of the GaAs. This doped layer is then connected to a control electrode by an electrical wire. A potential difference is then applied to the core 21 of the photonic wire 20 between its top and its base. The resulting vertical electric field leads to a shift by the Stark effect of the energy levels of the excitonic states $X_x$ and $X_y$.

It is then possible simultaneously to reduce and cancel the energy separation S and to adjust the frequency of the first photon emitted in the radiative cascade, the frequency of the second photon emitted (the energy level of $X_x$ then being equal to that of $X_y$), or even the energy difference between the two photons emitted.

Furthermore heating electrodes may be arranged on the substrate 10 in proximity to the photonic wire 20. The electrical current between these electrodes causes heating in the vicinity of the foot of the photonic wire 20, making it possible to modify the energies of the photons emitted without modifying the energy separation S. In combination with the variant above, it is then possible simultaneously to reduce and cancel the energy separation S and to adjust the frequency of the photons emitted, by adjusting the heating temperature and the strength of the vertical electric field.

In one variant (not represented), the light source 1 may comprise a device for excitation by electrical injection. To this end, the core 21 comprises an upper end formed by a layer of heavily n-type doped GaAs, without the aforementioned barrier layer made of an electrically insulating material, for example $Ga_{0.2}Al_{0.8}As$. The dielectric layer is replaced with a transparent conductive layer, for example a layer of ITO. The core 21 of the photonic wire 20 comprises an n-type doped zone, for example between $10^{16}$ and $10^{17}$ $cm^{-3}$, extending along the Z axis from the n+ doped GaAs layer to a height lying a few tens of nanometers, for example 50 nm, above the quantum dot 24. It comprises a p-type doped zone extending along the Z axis from a height lying a few tens of nanometers, for example 50 nm, below the quantum dot 24 to the base of the core 21. The electrical injection then makes it possible to inject electron-hole pairs electrically into the quantum dot 24.

The invention claimed is:

1. A light source configured to emit a pair of polarization-entangled photons, comprising:
   a substrate, comprising a reflective layer;
   a photonic wire, comprising a core having a refractive index $n_c$ and:
      being arranged on the substrate, facing the reflective layer, and extending longitudinally along a principal axis Δ substantially orthogonal to the plane of the substrate;
      comprising an emitter configured to emit a pair of photons which are intended to be entangled in polarization;
      having transverse dimensions, in a plane parallel to the substrate and containing the emitter, such that the core forms a single-mode waveguide for the emitted photons, a guided optical mode being degenerate in polarization;
      these transverse dimensions varying longitudinally in the direction of an upper end of the core so as to form a mode adapter for the guided optical mode;
   an optical excitation device configured to excite the emitter and thus cause spontaneous emission of at least one pair of photons by the emitter;
   the photonic wire furthermore comprising a cladding:
      having a refractive index $n_g$ less than $n_c$;
      extending in a plane parallel to the substrate, starting from the core, and having a maximum dimension with respect to the principal axis Δ defining a principal transverse axis $At_g$ such that it has an asymmetry of revolution about the principal axis Δ;
   a correction device configured to induce by electrostatic effect a mechanical deformation of the photonic wire in a plane parallel to the substrate, along a deformation axis Ad forming an angle of inclination of between 0° and 90°, these values being exclusive, with respect to the principal transverse axis $At_g$, the mechanical deformation leading to mechanical strains experienced by the emitter, thus improving the degree of entanglement of the photon pair.

2. The light source as claimed in claim 1, wherein the correction device comprises:
   at least two electrodes,
      configured to generate a nonuniform electric field,
      arranged on either side of the photonic wire in such a way that the photonic wire has a distance $D_p$ from the proximal one of the electrodes less than a distance $D_d$ from the other, distal electrode, the deformation axis Ad being defined as passing through an end of the proximal electrode oriented toward the photonic wire and the principal axis Δ;
   an electrical voltage source connected to the electrodes in order to generate said electric field, the value of the voltage being predefined in such a way that the photon pair is entangled in polarization.

3. The light source as claimed in claim 2, wherein the correction device comprises pillars which rest on the substrate and are separate from the photonic wire, and on which the electrodes rest; the core of the photonic wire and the pillars being produced on the basis of the same crystalline material.

4. The light source as claimed in claim 3, wherein the core of the photonic wire and the pillars have the same height with respect to the substrate.

5. The light source as claimed in claim 1, wherein the emitter has a biexcitonic state XX, two excitonic states $X_x$, $X_y$ and a ground state G, two optical dipoles being associated with the excitonic transitions between the biexcitonic state XX and the excitonic states $X_x$, $X_y$ and between the excitonic states $X_x$, $X_y$, and the ground state, the optical dipoles having linear polarizations oriented along mutually orthogonal optical axes x, y and being located in a plane parallel to the substrate, the deformation axis Ad being aligned with one of the optical axes x, y.

6. The light source as claimed in claim 1, wherein the emitter is located on the principal axis Δ, to within 20 nm.

7. The light source as claimed in claim 1, wherein the core of the photonic wire has a symmetry of rotation about the optical axis Δ with an order equal to 4.

8. The light source as claimed in claim 1, wherein the core of the photonic wire is produced on the basis of a crystalline material selected from among III-V compounds or II-VI compounds, and wherein the emitter is formed by at least one semiconductor quantum dot.

9. A method for manufacturing a light source as claimed in claim 1, comprising the following steps:
   producing a stack comprising:
      a substrate comprising a reflective layer coated with a transparent etch stop layer;
      a first and a second layer resting on the transparent layer and produced from a crystalline material with a refractive index $n_c$, between which the emitter is located;
   producing the core of the photonic wire by localized etching of the stack;
   producing the cladding in such a way that it extends from the core along a principal transverse axis $At_g$ in a plane parallel to the plane of the substrate.

10. The manufacturing method as claimed in claim 9, wherein the cladding is produced by physical vapor deposition along a deposition direction parallel to the desired principal transverse axis $At_g$ and forming an angle of inclination with respect to the plane of the substrate of less than 90°, and preferably less than or equal to 20°.

11. The manufacturing method as claimed in claim 9, wherein the cladding is produced by deposition of a dielectric encapsulation layer enclosing the core of the photonic wire in a plane parallel to the substrate over the entire height of the core, lithography then localized etching of the dielectric encapsulation layer.

12. The manufacturing method as claimed in claim 9, wherein pillars are simultaneously produced by localized etching of the stack during the production of the core of the photonic wire, and wherein at least two electrodes are produced on upper faces of the pillars, said electrodes being arranged on either side of the core of the photonic wire.

* * * * *